US006744008B1

(12) United States Patent
Kasahara et al.

(10) Patent No.: US 6,744,008 B1
(45) Date of Patent: Jun. 1, 2004

(54) LASER APPARATUS AND LASER ANNEALING METHOD

(75) Inventors: Kenji Kasahara, Kanagawa (JP); Ritsuko Kawasaki, Kanagawa (JP); Hisashi Ohtani, Kanagawa (JP); Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/640,521

(22) Filed: Aug. 17, 2000

(30) Foreign Application Priority Data

Aug. 18, 1999 (JP) .......................................... 11-231211
Aug. 31, 1999 (JP) .......................................... 11-244204

(51) Int. Cl.⁷ ......................................... B23K 26/067
(52) U.S. Cl. .......................... 219/121.65; 219/121.66; 219/121.74; 219/121.77; 438/487
(58) Field of Search ................. 219/121.65, 121.66, 219/121.82, 121.76, 121.77, 121.74; 438/487, 795, 799

(56) References Cited

U.S. PATENT DOCUMENTS

| | | | | |
|---|---|---|---|---|
| 4,020,319 A | * | 4/1977 | Shepard et al. | |
| 4,069,080 A | * | 1/1978 | Osborne | |
| 4,234,356 A | * | 11/1980 | Auston et al. | 438/799 |
| 4,925,273 A | * | 5/1990 | Maisenbacher et al. | |
| 5,219,786 A | | 6/1993 | Noguchi | |
| 5,612,251 A | * | 3/1997 | Lee | 438/795 |
| 5,767,003 A | | 6/1998 | Noguchi | 438/487 |
| 5,854,803 A | * | 12/1998 | Yamazaki et al. | |
| 5,910,262 A | * | 6/1999 | Baumgart et al. | 219/121.77 |
| 5,952,058 A | * | 9/1999 | Xuan | |
| 6,020,045 A | * | 2/2000 | Chen et al. | |
| 6,087,625 A | * | 7/2000 | Iso | |
| 6,091,047 A | * | 7/2000 | Miyakawa et al. | |
| 6,171,890 B1 | * | 1/2001 | Adachi et al. | |
| 6,210,996 B1 | | 4/2001 | Yamazaki et al. | |
| 6,266,167 B1 | * | 7/2001 | Klug et al. | |
| 6,300,176 B1 | | 10/2001 | Zhang et al. | |
| 6,322,625 B2 | * | 11/2001 | Im | |
| 6,426,245 B1 | * | 7/2002 | Kawasaki et al. | |

FOREIGN PATENT DOCUMENTS

JP          11-219133      8/1999
JP          2000-150412    5/2000

OTHER PUBLICATIONS

K. Shimizu et al., "High–Mobility Poly–Si Thin–Film Transistors Fabricated by a Novel Excimer Laser Crystallization Method", IEEE Transactions on Electron Devices, vol. 40, No. 1, pp. 112–117, 1993.
F. Secco d'Aragona, "Dislocation Etch for (100) Planes in Silicon", J. Electrochem. Soc., vol. 119, No. 7, pp. 948–951, 1972.
Specification & Drawings of U.S. patent application Ser. No. 09/640,084.
Specification & Drawings of U.S. patent application Ser. No. 09/988,389.
Specification & Drawings of U.S. patent application Ser. No. 09/811,701.
U.S. patent application Ser. No. 09/635,422, Shunpei Yamazaki et al., Laser Apparatus, Laser Annealing Method, and Manufacturing Method of a Semiconductor Device, Aug. 10, 2000.

* cited by examiner

Primary Examiner—Geoffrey S. Evans
(74) Attorney, Agent, or Firm—Eric J. Robinson; Robinson Intellectual Property Law Office, PC

(57) ABSTRACT

For crystallizing an amorphous semiconductor film by means of irradiation of laser beams, a top surface and a back surface of the amorphous semiconductor film are irradiated with the laser beams. In this case, an effective energy intensity $I_o$ of the laser beams to be applied onto the top surface and an effective energy intensity $I_o'$ of the laser beams to be applied onto the back surface satisfy the relationship of $0 < I_o'/I_o < 1$ or $1 < I_o'/I_o$. Thus, a laser annealing method capable of providing a crystalline semiconductor film with large grain diameters can be provided.

35 Claims, 19 Drawing Sheets

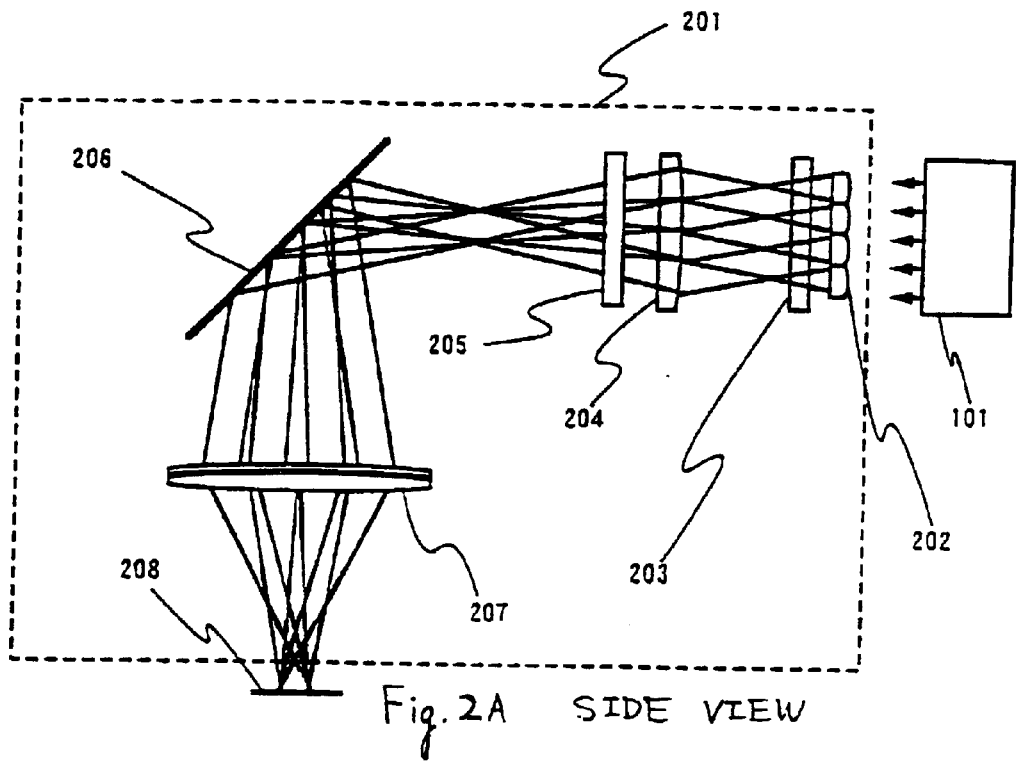
Fig. 2A  SIDE VIEW
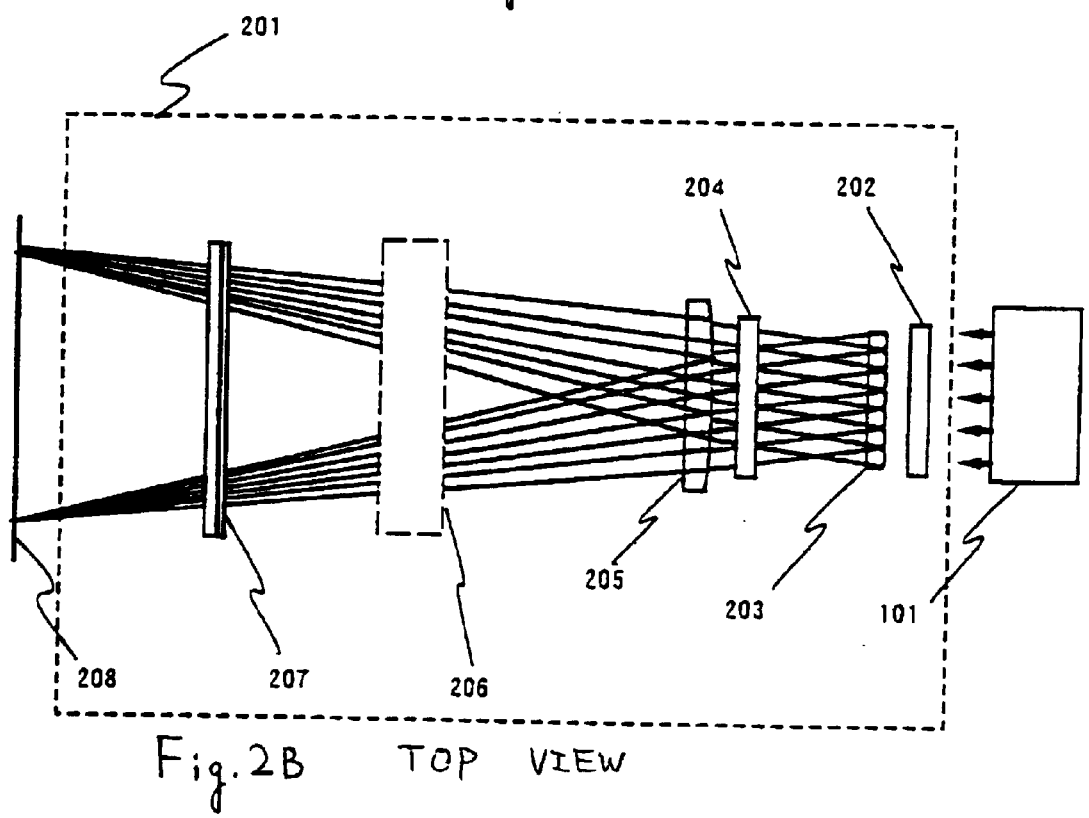
Fig. 2B  TOP VIEW

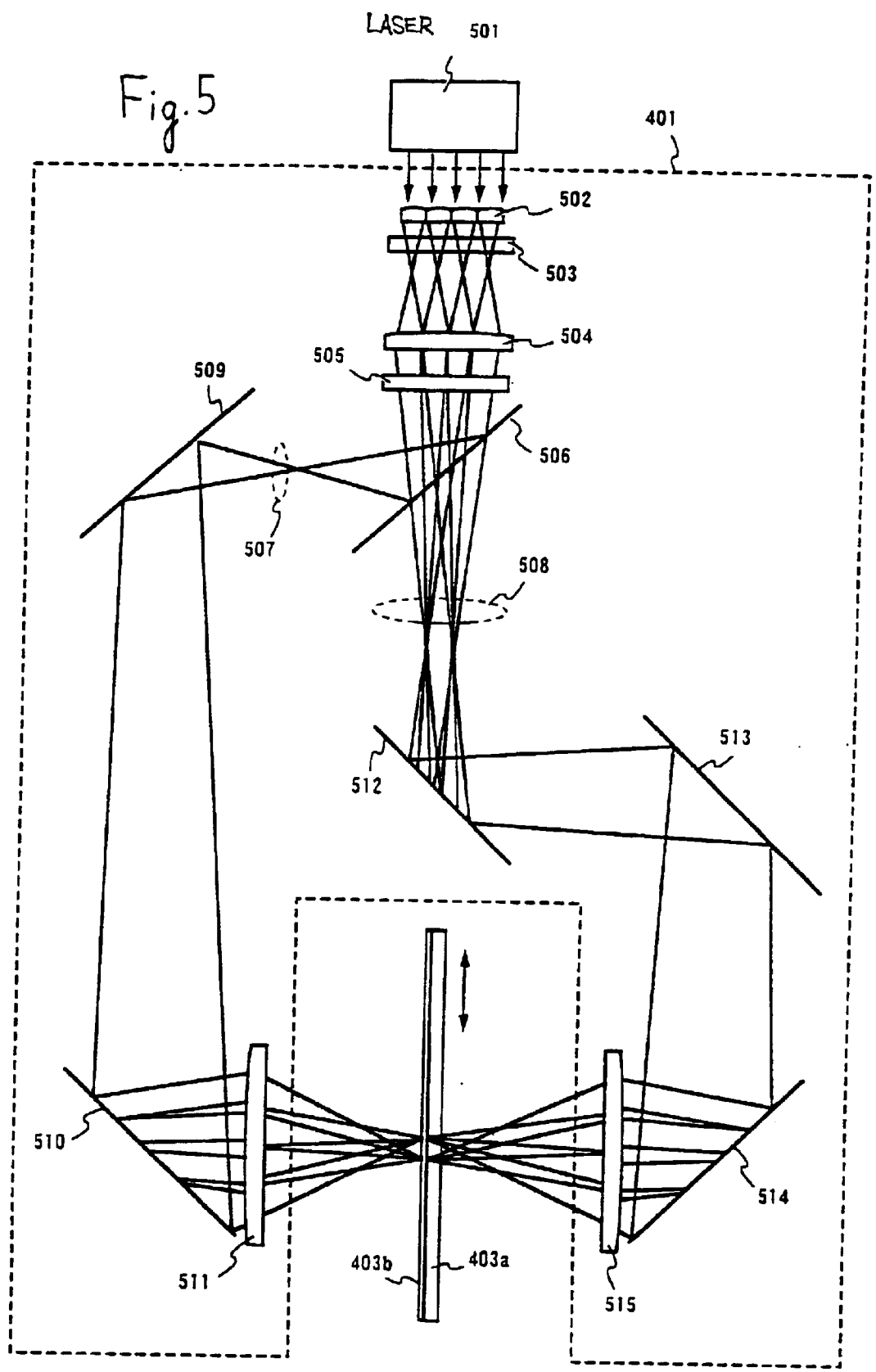

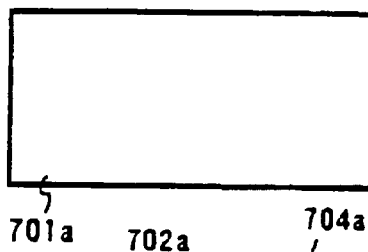
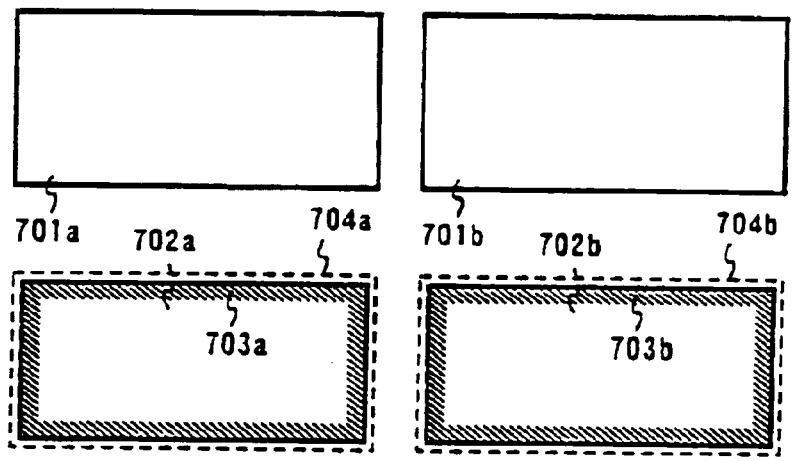
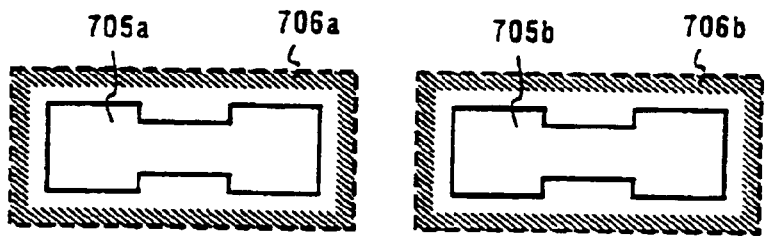
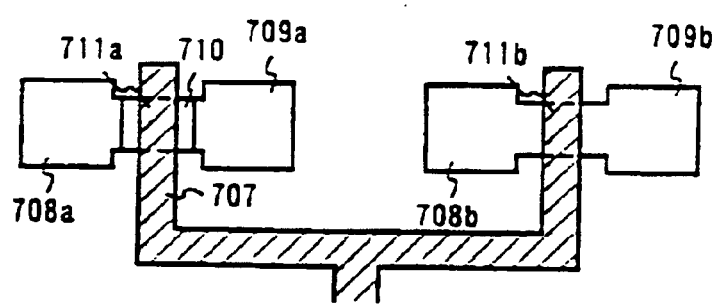
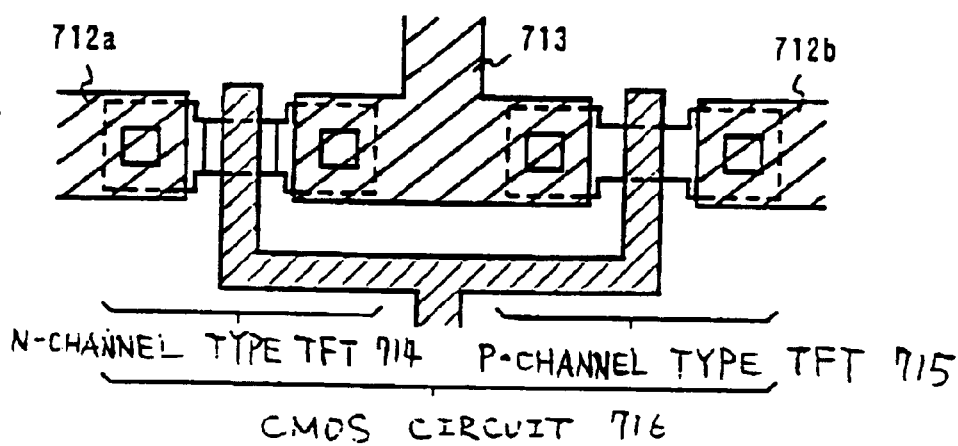

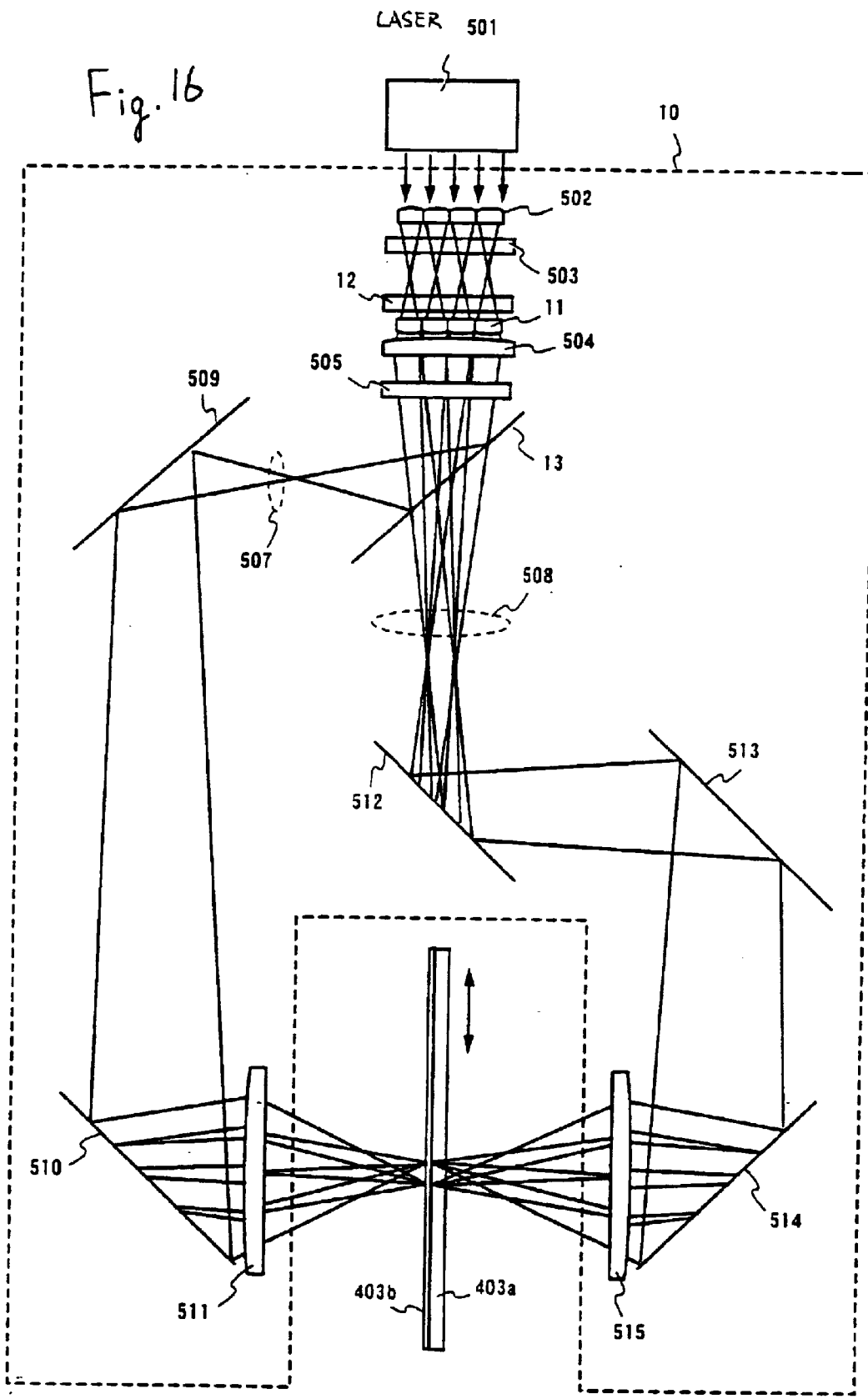

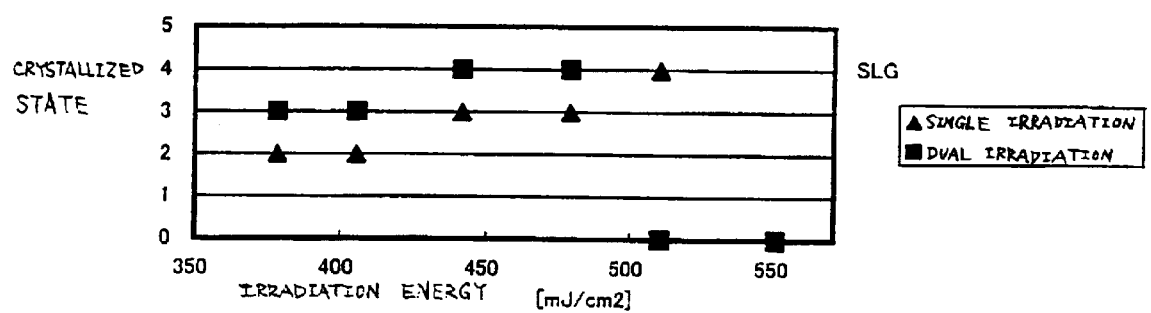
Fig. 20  IRRADIATION ENERGY AND CRYSTALLIZED STATE

LASER APPARATUS AND LASER ANNEALING METHOD

BACKGROUND OF THE INVENTION

1. Field of the Invention

The present invention relates to a method of annealing a semiconductor film with laser beams (hereinbelow referred to as laser annealing) and a laser apparatus to be used for performing the same (more specifically, an apparatus including a laser source and an optical system for guiding laser beams emitted from the laser source to an object to be processed).

2. Description of the Related Art

In recent years, developments of thin film transistors (hereinbelow referred to as TFTs) has been advanced, and in particular, TFTs employing a polycrystalline silicon film (polysilicon film) as a crystalline semiconductor film has drawn much attention. Especially, in a liquid crystal display device (liquid crystal display) or an EL (electro-luminescence) display device (EL display), these TFTs are used as elements for switching pixels and elements constituting a driver circuit for controlling the pixels.

In common techniques for obtaining a polysilicon film, an amorphous silicon film) is crystallized to obtain a polysilicon film. In particular, a method of crystallizing an amorphous silicon film with laser beams has been receiving much attention. In the present specification, the technique for crystallizing an amorphous semiconductor film with laser beams to obtain a crystalline semiconductor film is referred to as laser crystallization.

The laser crystallization enables instantaneous heating of a semiconductor film, and thus it is an effective technique for annealing a semiconductor film formed on a substrate having low heat-resistance, such as a glass substrate, a plastic substrate or the like. In addition, the laser crystallization has a significantly higher throughput, as compared to conventional heating means employing an electric furnace (hereinbelow ref erred to as furnace annealing).

Although various kinds of laser beams are available, laser beams emitted from a pulse-oscillated excimer laser (hereinbelow referred to as excimer laser beams) are generally used in the laser crystallization. The excimer laser can provide a large output power and repeat irradiation at high frequencies. Furthermore, the excimer laser beams have an advantage of a high absorption coefficient against a silicon film.

One of the most important problems to be solved in these days is how to enlarge the diameters of crystal grains in a crystalline semiconductor film crystallized with laser beams. It is clear that the larger each crystal grain (also simply referred to as a grain) is, the less number of grains traverse TFTs, in particular. channel-formation regions thereof. This enables improvements in the fluctuation of typical electrical characteristics of TFTs, such as a field effect mobility or a threshold voltage.

In addition, since relatively satisfactory crystallinity is maintained at the inside of each grain, it is desirable, when fabricating TFTs, to dispose the entire channel-formation region within a single grain so as to improve the above-mentioned various operational characteristics of TFTs.

However, it is difficult to obtain a crystalline semiconductor film having sufficiently large grain diameters with employment of presently available techniques. Although some results have been reported indicating that such a crystalline semiconductor film with sufficiently large grain diameters was experimentally obtained those reported techniques have not reached practical levels yet.

For example, in the experimental level, the results have been achieved as described in the article entitled "High-mobility poly-Si thin-film transistors fabricated by a novel excimer laser crystallization method" by K. Shimizu, O. Sugiura and M. Matsumura in IEEE Transactions on Electron Devices, vol. 40, No. 1, pp. 112–117 (1993). In this article, a three-layered structure of $Si/SiO_2/n^+Si$ is formed on a substrate, and this layered structure is irradiated with excimer laser beams from both the Si side and the $n_+Si$ side. The article explained that larger grain diameters can be thus obtained.

The present invention is intended to overcome the above-mentioned disadvantages In the art by providing a laser annealing method capable of providing a crystalline semiconductor film with larger grain diameters, and a laser apparatus to be used in such a laser annealing method.

SUMMARY OF THE INVENTION

In accordance with the present invention, upon crystallization of an amorphous semiconductor film, a top surface (on which a thin film is to be deposited) and a back surface (a surface opposite to the top surface) of the amorphous semiconductor film are simultaneously irradiated with laser beams while an effective energy intensity of the laser beams to be applied onto the top surface (hereinafter referred to as first laser beams) is set at a level different from that of the laser beams to be applied onto the back surface (hereinafter referred to as second laser beams).

More specifically, the irradiation conditions of the laser beams are set so that the effective energy intensity ratio $Io'/Io$ between the effective energy intensity $Io$ of the first laser beams and the effective energy intensity $Io'$ of the second laser beams satisfies the relationship of $0<Io'/I_o<1$ or $1<I_o'/I_o$, where the product of $I_o$ and $I_o'$ ($I_o \times I_o'$) is not equal to zero.

In the present specification, the term "effective energy intensity" is defined as the energy intensity of the laser beams at the top or back surface of an amorphous semiconductor film while taking energy losses, caused by various reasons such as reflection or the like, into consideration. The unit of the effective energy intensity is the same as that of the energy density, i.e., $mJ/cm^2$. Although the effective energy intensity can not be directly measured, it can be calculated based on known parameters such as a reflectance or a transmittance as long as medium present along a path of the laser beams is known.

For example, the calculation method of the effective energy intensity will be described in more detail by taking as an example the case where the present invention is applied to the structure as illustrated in FIG. 6. In FIG. 6, reference numeral 601 denotes a reflector made of aluminum, 602 denotes a Corning #1737 substrate (having a thickness of 0.7 mm), 603 denotes a silicon oxynitride film (hereinbelow referred to as SiON film) having a thickness of 200 nm, and 604 denotes an amorphous silicon film having a thickness of 55 nm. This sample is irradiated with XeCl excimer laser beams having a wavelength of 308 nm in air.

The energy intensity of the excimer laser beams (with the wavelength of 308 nm) immediately before reaching the amorphous silicon film 604 is represented as $I_a$. Taking into consideration the reflection of the laser beams at the surface of the amorphous silicon film, the effective energy intensity $I_o$ of the first laser beams can be expressed as $I_o=I_a \times (1-R_{Si})$, where $R_{Si}$ indicates the reflectance of the laser beams. In this case, $I_o$ is calculated as $0.45 \times I_a$.

Furthermore, the effective energy intensity $I_o'$ of the second laser beams can be expressed as $I_o' = I_a \times T_{1737} \times R_{Al} \times T_{1737} \times (1-R_{SiON-Si})$ where $T_{1737}$ indicates the transmittance of the #1737 substrate, $R_{Al}$ indicates the reflectance at the aluminum surface, and $R_{SiON-Si}$ indicates the reflectance experienced by the light beams incident onto the amorphous silicon film from the SiON film. The reflectance experienced by the light beams incident onto the SiON film from air, the transmittance in the SiON film, the reflectance experienced by the light beams incident on the #1737 substrate from the SiON film, and the reflectance experienced by the light beams incident on the SiON film from the #1737 substrate are found to be negligible from the experimental results, and therefore not considered in the calculation. In this case, $I_o'$ is calculated as $0.13 \times I_a$.

Accordingly, in the structure illustrated in FIG. 6, the effective energy intensity $I_o$ of the first laser beams and the effective energy intensity $I_o'$ of the second laser beams can be calculated as $0.45 I_a$ and $0.13 I_a$, respectively. Thus, the effective energy intensity ratio $I_o'/I_o$ can be calculated as 0.29. The fact that the effective energy intensity ratio thus calculated satisfies the relationship of $0 < I_o'/I_o < 1$ is one of the features of the present invention.

Furthermore, the present invention is applicable to the case where the intensity of the first laser beams is smaller than that of the second laser beams. In other words, the present invention is applicable to the case where the relationship of $1 < I_o'/I_o$ is satisfied.

The effective energy intensities of the first and second laser beams can be set at different levels by, for example, the following manners:

1) When the top and back surfaces of an amorphous semiconductor film are irradiated with laser beams by means of ea reflector disposed below a substrate, the effective energy intensity of the second laser beams is attenuated by adjusting the reflectance of the reflector so as to become smaller as compared to the effective energy intensity of the first laser beams.

2) The first laser beams are divided to form the second laser beams, and either the effective energy intensity of the first laser beams or that of the second laser beams is attenuated by means of an appropriate filter (such as a variable attenuator or the like) so that the effective energy intensities of the first and second laser beams are set at different levels from each other.

3) The effective energy intensity of the second laser beams is attenuated in accordance with a material of the substrate on which an amorphous semiconductor film is to be deposited, so as to become smaller as compared to the effective energy intensity of the first laser beams.

4) An insulating film is provided between the substrate and the amorphous semiconductor film so that the effective energy intensity of the second laser beams is attenuated by the insulating film, thereby resulting in the smaller effective energy intensity as compared to the effective energy intensity of the first laser beams.

5) The surface of the amorphous semiconductor film is covered with an insulating film so that the reflectance of the first laser beams at the surface of the amorphous semiconductor film becomes smaller, thereby resulting in the effective energy intensity of the first laser beams being larger as compared to that of the second laser beams.

6) The surface of the amorphous semiconductor film is covered with an insulating film so that the effective energy intensity of the first laser beams is attenuated by the insulating film, thereby resulting in the smaller effective energy intensity as compared to the effective energy intensity of the second laser beams.

7) The first and second laser beams are emitted from different oscillating sources, respectively, so that the effective energy intensities of both laser beams are set at different levels.

It should be noted that the present invention is not limited to a specific type of lasers. Rather, various lasers can be used in the present invention: for example, generally known excimer lasers (typically a KrF laser or a XeCl laser), solid-state lasers (typically a Nd:YAG laser or a ruby laser), gas lasers (typically an Ar laser or a He—Ne laser), metal vapor lasers (typically a Cu vapor laser or a He—Cd laser), or semiconductor lasers.

In the case where the laser such as Nd:YAG laser which has a fundamental wave (the first harmonic wave) of a long wavelength (1064 nm for Nd:YAG laser) is used, it is preferable to use the second, third or fourth harmonic wave. These high-order harmonic wave can be obtained by means of non-linear crystal (non-linear device). Alternatively, a well-known Q-switch may be used to obtain the higher-order harmonic wave.

BRIEF DESCRIPTION OF THE DRAWINGS

In the accompanying drawings:

FIG. 2A illustrates a side view of the optical system configuration of the laser apparatus shown in FIGS. 1A and 1B;

FIG. 2B illustrates a top view of the optical system configuration of the laser apparatus shown in FIGS. 1A and 1B;

FIG. 5 illustrates the optical system configuration of the laser apparatus shown in FIGS. 4A and 4B;

FIGS. 13A through 13E illustrate views intended to explain various steps in the process for fabricating a CMOS circuit incorporating TFTs therein;

FIG. 16 illustrates the configuration of another optical system of a laser apparatus In accordance with the present invention;

FIG. 20 shows the graph indicating the relationship between the irradiation energy and the crystallized state.

DETAILED DESCRIPTION OF THE PREFERRED EMBODIMENTS

Figure 7A:
FIGS. 7A and 7B are SEM photographs of grains of polysilicon films.
Figure 7B:
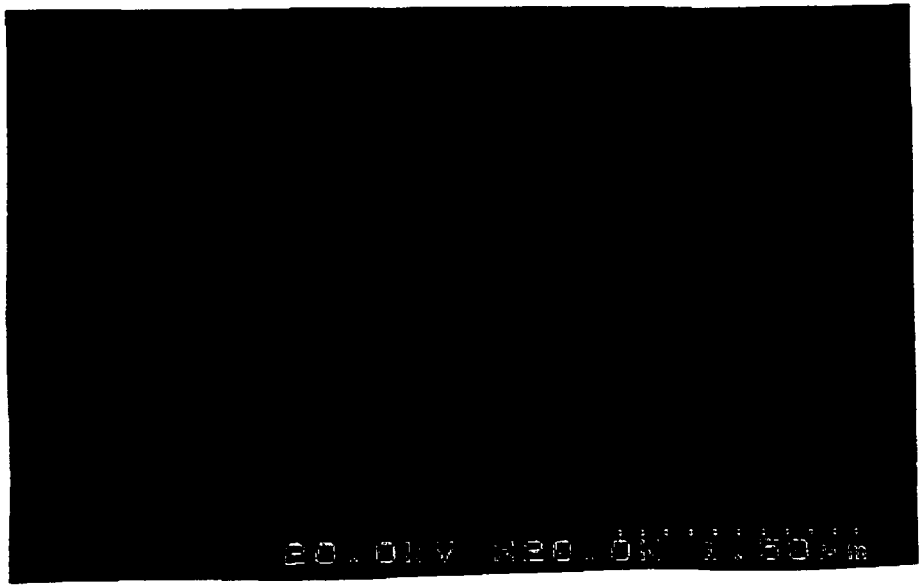

Prior to the descriptions of the preferred embodiments of the present invention, how the Inventors arrived at the present invention will be briefly explained. FIGS. 7A and 7B are SEM (Scanning Electron Microscopy) photographs of polysilicon films, formed by the laser annealing, taken after the Secco etching process. Details of the Secco etching process are described, for example, in the article entitled "Dislocation etch for (100) Planes in Silicon" by F. Secco d'Aragona in J. Electrochem. Soc., Vol. 119, No. 7, pp. 948–950 (1972).

In both FIGS. 7A and 7B, an amorphous silicon film (having a thickness of 55 nm) is formed on a Corning #1737 substrate (having a thickness of 0.7 mm) with a silicon oxide film (having a thickness of 200 nm) interposed therebetween, and is irradiated with excimer laser beams. As the excimer laser beams, pulse laser beams with a wavelength of 308 nm are emitted with a XeCl gas being used as an excitation gas, and have a pulse width of 30 ns, the number of shots of 20, and an energy density of 370 mJ/cm$^2$.

FIG. 7A shows the polysilicon film crystallized through the laser crystallization in which only the top surface thereof is irradiated with the laser beams (the resultant average grain diameter is about 0.3 $\mu$m), while FIG. 7B shows the polysilicon film crystallized through the laser crystallization in which both the top and back surfaces thereof are irradiated with the laser beams (the resultant average grain diameter is about 1.5 $\mu$m). From these results, it has been confirmed that the polysilicon film crystallized through the laser crystallization in which both the top and back surfaces thereof are irradiated with the laser beams has the grain diameters five times as large as those in the polysilicon film obtainable when only the top surface thereof is irradiated with the laser beams, and therefore the laser irradiation from both sides is significantly effective.

The term "average grain diameter" used in the present specification is defined in accordance with the definition of the term "an average diameter in a crystal grain region" described in the specification of Japanese Patent Application No. 10-020566.

As described above, it has been confirmed that the laser irradiation from both sides of the amorphous semiconductor film can lead to larger grain diameters in the resultant crystalline semiconductor film. It should be noted that in accordance with the experiments described in the above-mentioned prior art article, the back surface of the amorphous semiconductor film to be crystallized is not directly irradiated with laser beams, while being intended to employ the heat sink effect by utilizing remaining heat in the n$^+$Si layer, which are completely different from the experiments conducted by the present inventors to be described later.

Figure 8A:
FIGS. 8A and 8B are SEM photographs of grains of polysilicon films.
Figure 8B:
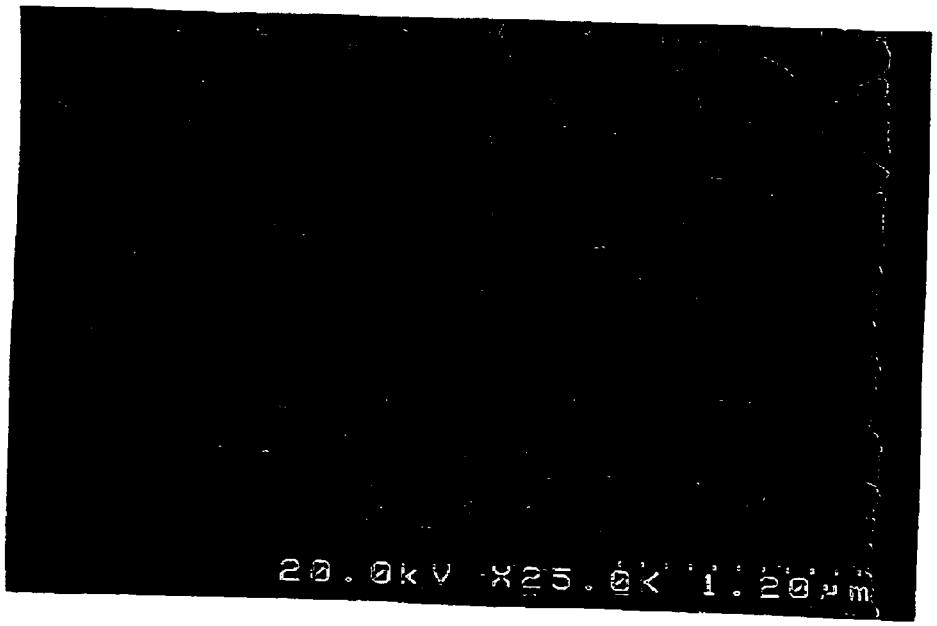

Then, the present inventors conducted the experiments similar to those in the above article, except that a quartz substrate was used instead of a glass substrate (in addition, the energy density was set at 200 mJ/cm$^2$), and the results, i.e., the SEM photographs after the Secco etching process as shown in FIGS. 8A and 8B were obtained.

FIG. 8A shows the polysilicon film crystallized through the laser crystallization in which only the top surface thereof is irradiated with the laser beams, while FIG. 8B shows the polysilicon film crystallized through the laser crystallization in which both the top and back surfaces thereof are irradiated with the laser beams. From these results, with the quartz substrate, the average grain diameter was as large as about 0.4 to 0.5 $\mu$m, and large grain diameters as obtained in the case as shown in FIG. 7B were not observed. In addition, no significant differences were recognized when both the top and back surfaces of the amorphous semiconductor film were irradiated with the laser beams. In other words, although both the top and back surfaces of the amorphous semiconductor film were irradiated with the laser beams, an effect of increasing the average grain diameter was not observed.

Figure 6:
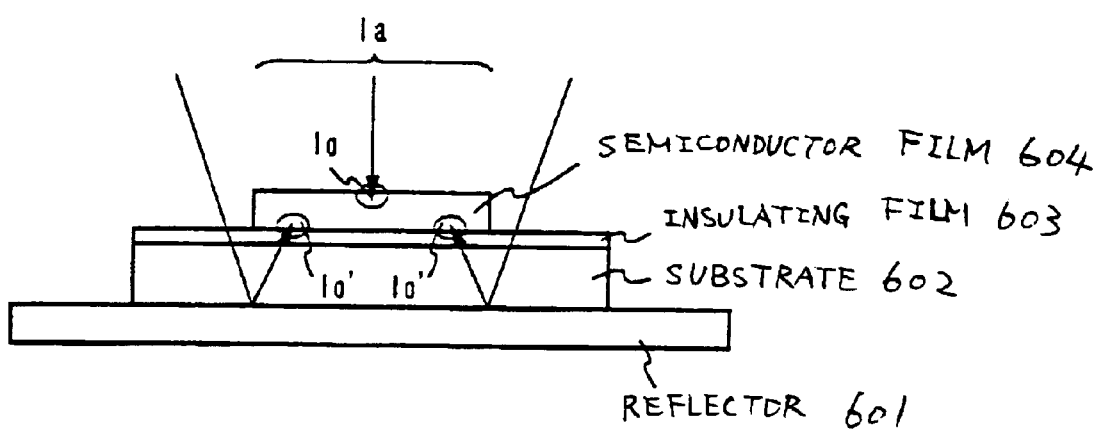
FIG. 6 illustrates a cross-sectional view intended to explain the first and second laser beams.

By comparing the above-described differences between FIGS. 7A and 7B and FIGS. 8A and 8B, the present inventors assumed that the differences might be brought due to a difference in transmittances of the glass substrate (about 50%) and the quartz substrate (about 93%), i.e., a difference in effective energy density of laser beams to be applied onto the back surface of the amorphous semiconductor film. Thus, the following experiments were further conducted in order to clarify the situation. More specifically, a sample with the structure as shown in FIG. 6 was prepared, in which a quartz substrate was used as the substrate 602, and a tantalum nitride film was used for providing the reflector 601. This sample was then irradiated with XeCl laser beams under the same conditions as employed for obtaining the SEM photograph in FIG. 7B, and the average grain diameter of the resultant polysilicon film was observed by means of the SEM photograph after the Secco etching process. The result is shown in FIG. 9.

Figure 9:
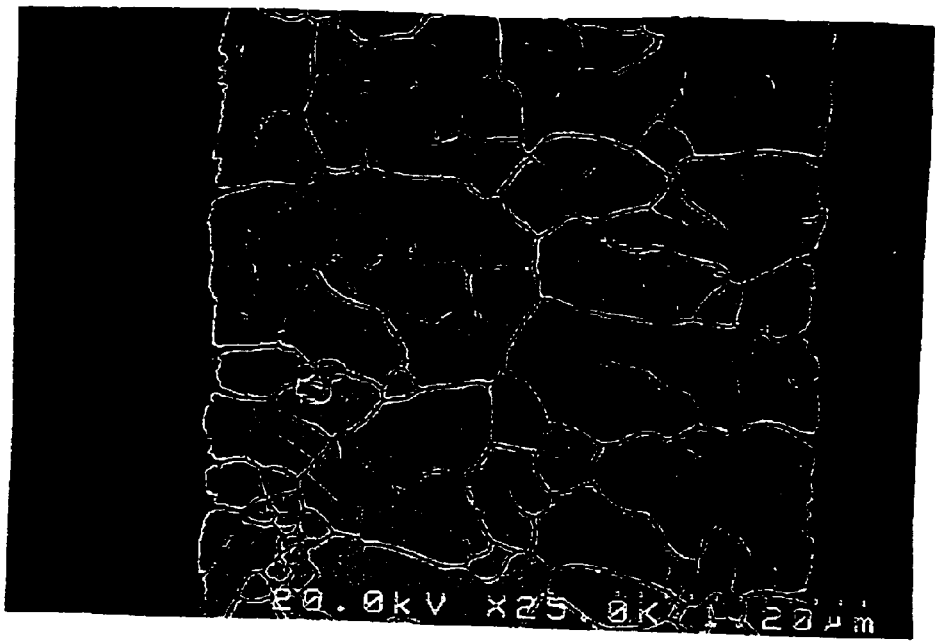
FIG. 9 is a SEM photograph of grains of a polysilicon film.

As can be seen from FIG. 9, grains in the resultant polysilicon film are scattered in the manner substantially similar to those in the polysilicon film in FIG. 7B. Furthermore, in the case where the SEM photograph of FIG. 7B was obtained, the effective energy intensity ratio between the first and second laser beams was 0.29, as mentioned previously. This result indicates that the second laser beams were substantially attenuated by the glass substrate. In the case of the sample in the present experiment, the effective energy intensity ratio was calculated to be 0.33. This result indicates that the second laser beams were substantially attenuated by the reflector.

The sample in FIG. 8B obtained by combining quartz and a reflector made of aluminum and the sample in FIG. 9 obtained by combining quartz and a reflector made of tantalum nitride have the same structure but different only in terms of the material on the surface of the reflector. Thus, the only significant difference is the reflectance at the reflector surface, and more specifically, the reflectance at the reflector surface of the sample in FIG. 9 is smaller than that in the sample in FIG. 8B.

From the above-described results, in the case where the top and back surfaces of an amorphous semiconductor film are irradiated with laser beams for crystallization, an increased average grain diameter can be obtained when the effective energy density of the laser beams to be applied to the back surface (the second laser beams) Is smaller than that of the laser beams to be applied to the top surface (the first laser beams).

Embodiment Mode 1

Figure 1A:
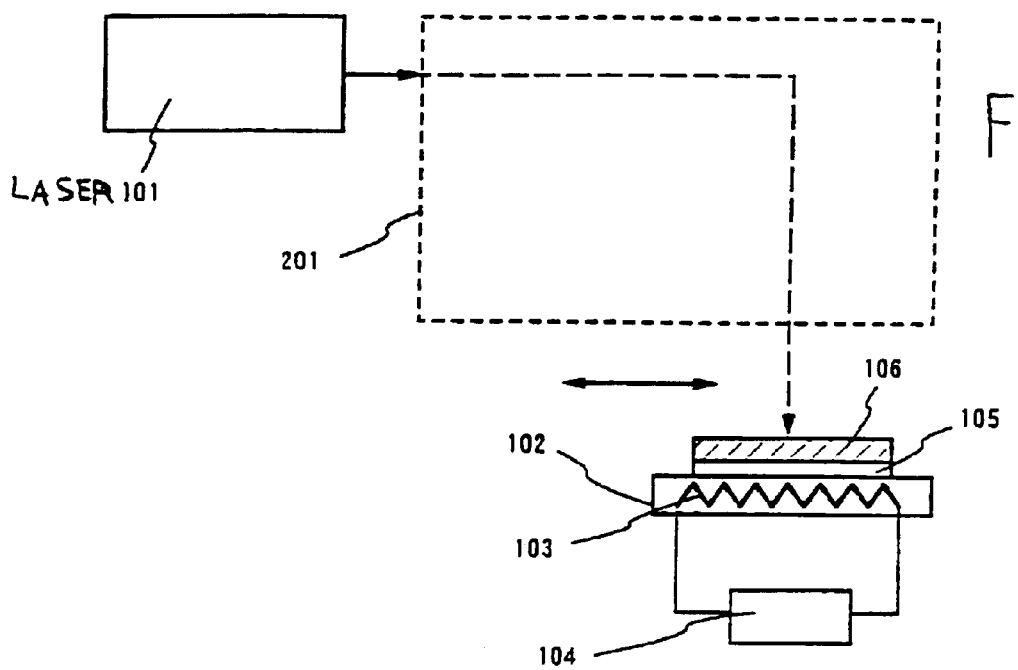
FIGS. 1A and 1B illustrate the configuration of a laser apparatus in accordance with the present invention.

One of embodiment modes of the present invention will be described. FIG. 1A illustrates the configuration of a laser apparatus in accordance with the present invention. This laser apparatus includes a laser source 101, an optical system 201 for linearly reshaping laser beams emitted from the laser source 101, and a stage 102 for securing a transparent substrate thereon. The stage 102 is provided with a heater 103 and a heater controller 104 so as to maintain the substrate in the temperature range from room temperature to 550° C. A reflector 105 is disposed on the stage 102, on which a substrate 106 with an amorphous semiconductor film formed thereon is to be placed.

A method of holding the substrate 106 in the laser apparatus having the configuration as shown in FIG. 1A will be described with reference to FIG. 1B. The substrate 106 held onto the stage 102 is placed in a reaction chamber 107, and is irradiated with the linear laser beams emitted from the laser source 101. The reaction chamber is set in the reduced pressure condition or filled with inert gas atmosphere by means of an evacuation system or a gas system (not Illustrated), so that the semiconductor film can be heated up to 100 to 450° C. without being contaminated.

The stage 102 is movable along guide rails 108 in the reaction chamber, so that the entire substrate can be irradiated with the linear laser beams. The laser beams are allowed to enter the reaction chamber through a quartz window (not illustrated) provided above the substrate 106. In the configuration shown in FIG. 1B, further provided are a transfer chamber 109, an intermediate chamber 110, a loading/unloading chamber 111 each coupled to the reaction chamber 107 either directly or indirectly. These chambers are separated from each other by partition valves 112 and 113.

The loading/unloading chamber 111 is provided with a cassette 114 capable of holding a plurality of substrates. These substrates are transported by a transportation robot 115 provided in the transfer chamber 109. Reference numeral 106' denotes a substrate being transported. With such a configuration, the laser annealing process can be successively conducted under the reduced pressure condition or in inert gas atmosphere.

The configuration of the optical system 201 for linearly reshaping the laser beams will be described with reference to FIGS. 2A and 2B. More specifically, FIG. 2A illustrates the optical system 201 seen from the side thereof, and FIG. 2B illustrates the optical system 201 seen from the above.

The laser beams emitted from the laser source 101 are divided along the longitudinal direction by a cylindrical lens array 202. The thus divided laser beams are further divided by another cylindrical lens array 203 but in this case in the lateral direction. Thus, the laser beams are eventually divided into matrix by the cylindrical lens arrays 202 and 203.

The divided laser beams are then converged by a cylindrical lens 204. The converging laser beams pass through another cylindrical lens 205 immediately after the cylindrical lens 204. The light beams are then reflected at a mirror 206 to pass through a cylindrical lens 207 and reach a surface 208 to be irradiated.

At this point, the laser beams projected onto the surface 208 have a linear irradiation surface. More specifically, the laser beams passed through the cylindrical lens 207 have a linear cross-section. Homogenization of the laser beams along its width direction (the direction of a shorter dimension) is conducted by means of the cylindrical lens array 202, the cylindrical lens 204, and the cylindrical lens 207, while homogenization of the laser beams along its longitudinal direction (the direction of a longer dimension) is conducted by means of the cylindrical lens array 203 and the cylindrical lens 205.

Then, the configuration to be used for applying the laser beams onto the top and back surfaces of the semiconductor film formed on the substrate will be described with reference to FIG. 3. More specifically, FIG. 3 shows the positional relationship between the substrate 106 and the reflector 105 shown in FIG. 1A.

Figure 3:
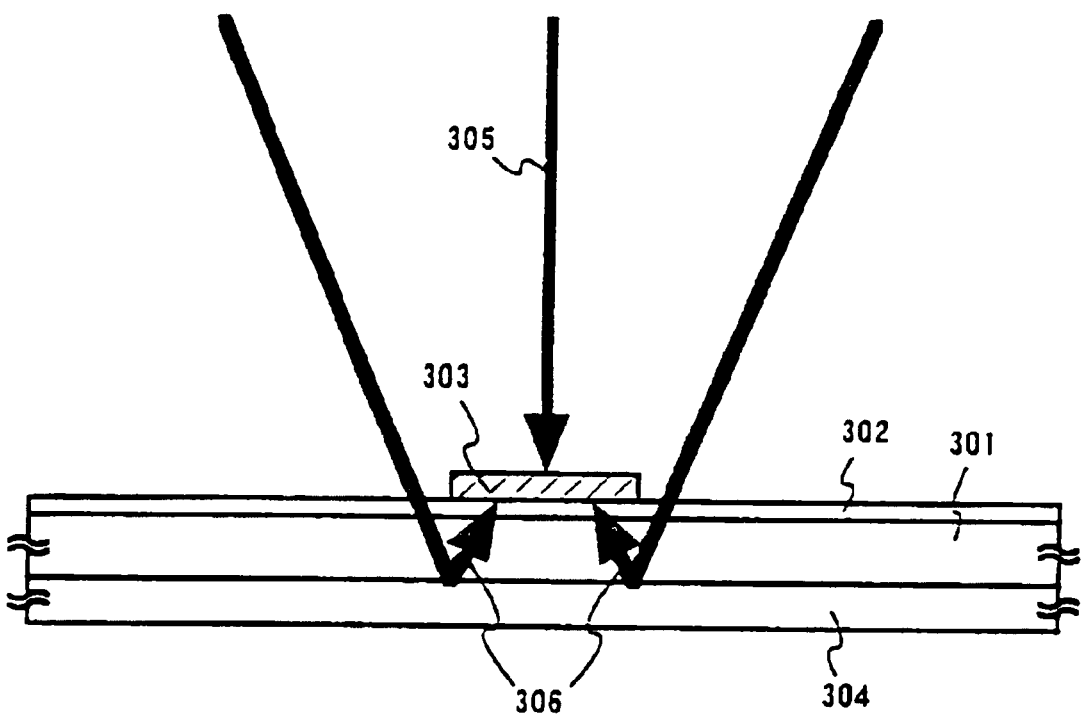
FIG. 3 illustrates a cross-sectional view intended to explain a laser annealing method.

In FIG. 3, on a top surface (on which a thin film or a device is to be formed) of a transparent substrate 301, an insulating film 302, and an amorphous semiconductor film (or a microcrystalline semiconductor film) 303 are formed. In addition, a reflector 304 for reflecting the laser beams is disposed beneath the transparent substrate 301.

As the transparent substrate 301, a glass substrate, a quartz substrate, a crystallized glass substrate, or a plastic substrate can be used. The effective energy intensity of the second laser beams may be adjusted by means of the transparent substrate 301 itself. The insulating film 302 may be made of an insulating film containing silicon, such as a silicon oxide film or a silicon oxynitride ($SiO_xN_y$) film. The effective energy intensity of the second laser beams may be adjusted by means of the insulating film 302. The amorphous semiconductor film 303 may be a compound semiconductor film such as an amorphous SiGe film, instead of an amorphous silicon film.

The reflector 304 may be a substrate with a metal film being formed onto its surface (a surface for reflecting the laser beams), or may be a substrate made of metal elements. The metal film in the above case can include any metal films made of various materials. Typically, a metal film containing either of silicon (Si), aluminum (Al), silver (Ag), tungsten (W), titanium (Ti), and tantalum (Ta) is used. Moreover, an alloy such as tungsten nitride (WN), titanium nitride (TiN), tantalum nitride (TaN) or the like may be used.

Furthermore, the reflector 304 may be disposed so as to be in contact with the transparent substrate 301, or separated therefrom. Instead of providing the reflector 304, a metal film as described above may be directly formed on a back surface (a surface opposite to the top surface) of the substrate 301 so as to allow the laser beams to be reflected there. In either case, the effective energy intensity of the second laser beams can be adjusted by controlling the reflectance of the reflector 304. Furthermore, in the case where the reflector 304 is disposed so as to be separated from the transparent substrate 301, the energy intensity of the second laser beams can be controlled by means of a gaseous substance (gas) to be filled into a gap therebetween.

The laser beams thus linearly reshaped by means of the optical system 201 described with reference to FIGS. 2A and 2B (only the cylindrical lens 207 is illustrated in the figures) are allowed to be incident onto the amorphous semiconductor film 303. The irradiation of the linearly reshaped laser beams is performed through scanning of the laser beams.

In either case, it is important that the effective energy intensity ratio ($I_o'/I_o$), with respect to the first laser beams 305 which passes through the cylindrical lens 207 to be incident on the top surface of the amorphous semiconductor film 303 and the second laser beams 306 which is once reflected at the reflector 304 to be incident on the back surface of the amorphous semiconductor film 303, satisfies the relationship $0<I_o'/I_o<1$ or $1<I_o'/I_o$. For that purpose, the reflectance of the reflector 304 with respect to the laser beams is preferably set in the range of 20 to 80%. In addition, a plurality of different means for attenuating the effective energy intensity of the second laser beams described in the present embodiment mode can be combined to obtain a desired intensity ratio.

The laser beams passed through the cylindrical lens 207 have an incident angle of 45° to 90° with respect to the substrate surface during being converged. Thus, the second laser beams 306 mi can travel around the amorphous semiconductor film 303 so as to be incident on the back surface 303 thereof. In addition, the laser beams may be randomly reflected by providing projections on a reflecting surface of the reflector 304, thereby resulting in the second laser beams 306 being obtained more effectively.

Embodiment Mode 2

Hereinbelow, another embodiment mode of the present invention, which is different from the previous embodiment mode, will be described. More specifically, in the present embodiment mode, the reflector as in the previous embodiment mode is not employed, and rather, two series of laser beams divided in the optical system are used for irradiation of an amorphous semiconductor film from both the top surface side and the back surface side thereof.

Figure 4A:
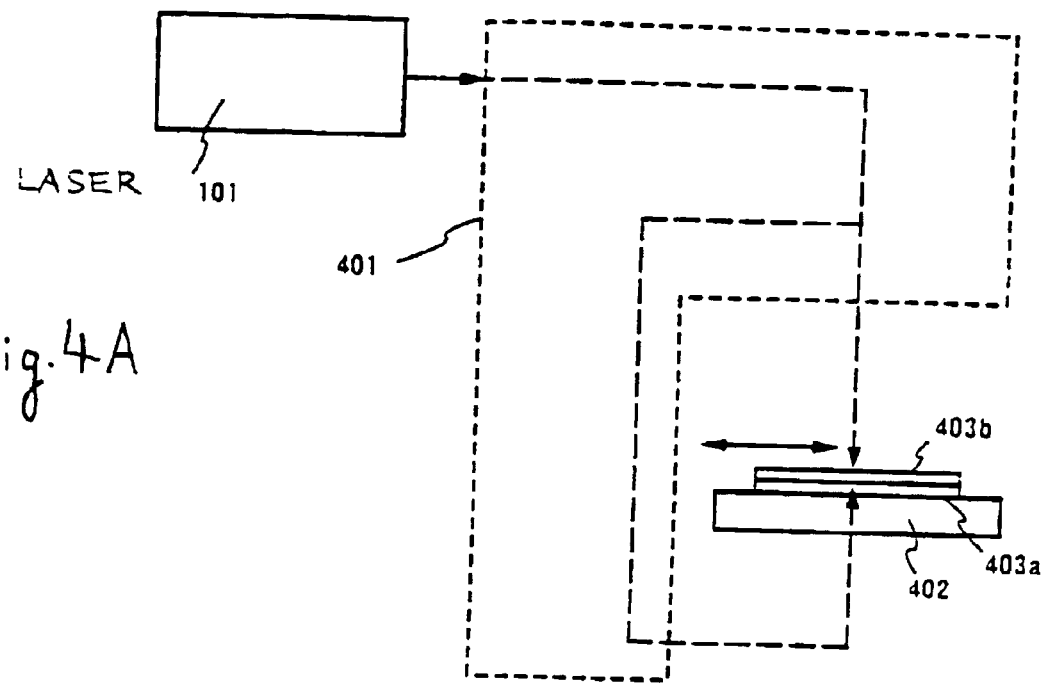
FIGS. 4A and 4B illustrate the configuration of another laser apparatus in accordance with the present invention.

FIG. 4A illustrates the configuration of a laser apparatus in accordance with the present embodiment mode. The basic structure of the apparatus in FIG. 4A is similar to that of the laser apparatus in FIGS. 1A and 1B, and therefore, only different portions are designated with different reference numerals. The similar components bear the same reference numerals.

The laser apparatus includes a laser source 101, an optical system 401 for linearly reshaping laser beams emitted from the laser source 101 and dividing them into two series, and a transparent stage 402 for securing a transparent substrate thereon. A substrate 403a is secured onto the stage 402, and an amorphous semiconductor film 403b is formed thereon.

In the present embodiment mode, the stage 402 has to be transparent since the laser beams passed through the stage 402 are used for irradiation of the amorphous semiconductor film 403b. In addition, a portion of the laser beams to be applied onto the amorphous semiconductor film 403b from the side closer to the stage 402 (i.e., the second laser beams) pass through the stage 402, and therefore, attenuation occurred when passing through the stage 402 has to be taken into consideration for obtaining the effective energy intensity.

Figure 4B:
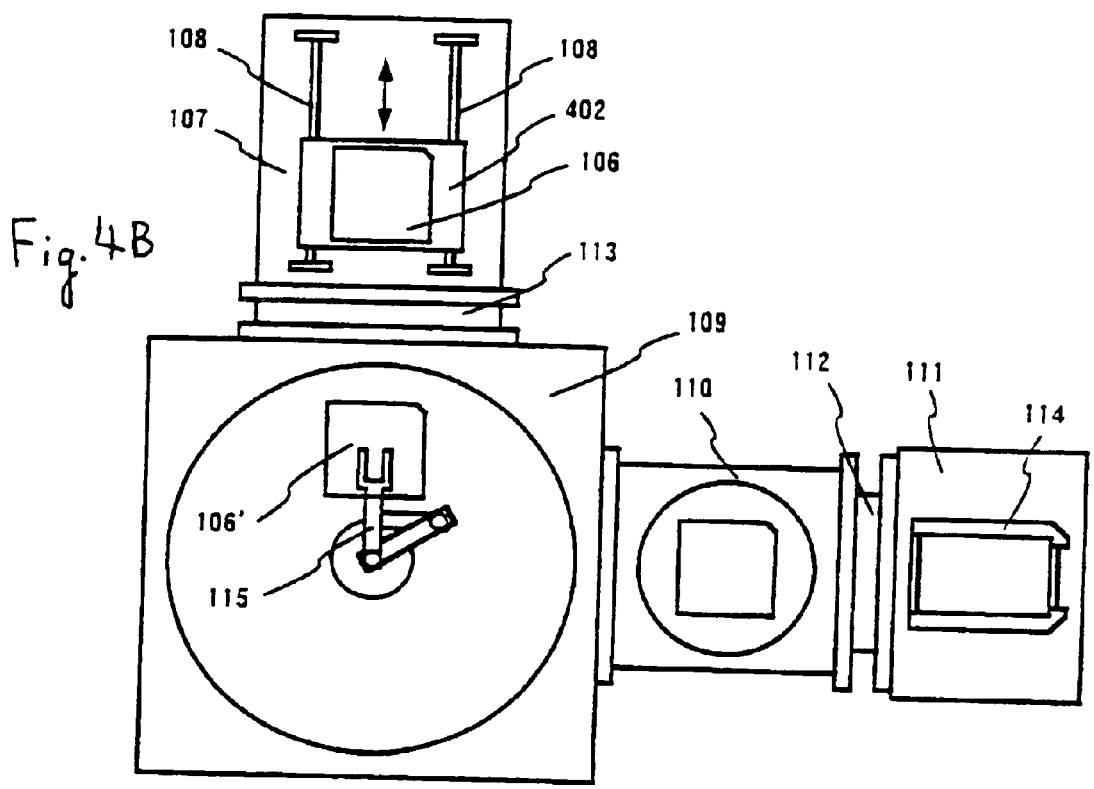

FIG. 4B explains a method of holding the substrate 403a in the laser apparatus as shown in FIG. 4A. The configuration is the same as the configuration of the laser apparatus as shown in FIG. 1B, except that the transparent stage 402 is used, and therefore, the explanation thereof will be omitted here.

The configuration of the optical system 401 shown in FIG. 4A will be described with reference to FIG. 5. More specifically, FIG. 5 illustrates the optical system 401 seen from the side thereof. The laser beams emitted from the laser source 501 are divided along the longitudinal direction by a cylindrical lens array 502. The thus divided laser beams are further divided by another cylindrical lens array 503 but in this case in the lateral direction. Thus, the laser beams are eventually divided into matrix by the cylindrical lens arrays 502 and 503.

The divided laser beams are then converged by a cylindrical lens 504. The converging laser beams pass through another cylindrical lens 505 immediately after the cylindrical lens 504. The configuration of the optical system to the extent as set forth above is the same as that shown in FIGS. 2A and 2B.

The laser beams are then incident on a half mirror 506 to be divided into first laser beams 507 and second laser beams 508. The first laser beams 507 are reflected successively at mirrors 509 and 510 and pass through a cylindrical lens 511 to reach the top surface of the amorphous semiconductor film 403b.

The second laser beams 508 obtained by the division by means of the half mirror 506 are successively reflected at mirrors 512, 513, and 514, and pass through a cylindrical lens 515 to reach the back surface of the amorphous semiconductor film 403b after passing through the substrate 403a.

As in the previous embodiment mode, the laser beams projected onto the substrate surfaces have a linear irradiation surface. Homogenization of this linearly reshaped laser beams along its width direction (the direction of a shorter dimension) is conducted by means of the cylindrical lens array 502, the cylindrical lens 504, and the cylindrical lens 515, while homogenization of the laser beams along its longitudinal direction (the direction of a longer dimension) is conducted by means of the cylindrical lens array 503, the cylindrical lens 505, and the cylindrical lens 511.

In either case, it is important that the effective energy intensity ratio ($I_{o'}/I_o$), with respect to the first laser beams which passes through the cylindrical lens 511 to be incident on the top surface of the amorphous semiconductor film 403b and the second laser beams which passes through the cylindrical lens 515 to be incident on the back surface of the amorphous semiconductor film 403b, satisfies the relationship $0<I_{o'}/I_o<1$ or $1<I_{o'}/I_o$.

In the present embodiment mode, the above-mentioned relationship is satisfied through the use of a glass substrate (made of such a material having a transmittance of about 50% or more with respect to the laser beams to be used) as the substrate 403a. It should be noted that the effective energy intensity of the second laser beams may be attenuated rather than by means of the substrate, but by means of an insulating film (not illustrated) provided on the substrate 403a, or by adjusting the transmittance of a stage (not illustrated) on which the substrate 403a is to be disposed, or the reflectance at the interface.

Furthermore, an optical attenuator filter may be disposed at any position along the optical path of the second laser beams in the optical system 401 to allow the effective energy intensity of the second laser beams to be attenuated. Alternatively, an optical attenuator filter may be disposed at any position along vie the optical path of the first laser beams in the optical system 401 to allow the effective energy intensity of the first laser beams to be attenuated.

In addition, a plurality of different means for attenuating the effective energy intensity of the first or second laser beams explained in the present embodiment mode can be combined to obtain a desired intensity ratio.

Hereinbelow, embodiments of the present invention will be described.

Embodiment 1

In the present embodiment, the case where an amorphous silicon film is crystallized with the configuration described in Embodiment Mode 1 will be described with reference to FIG. 3.

In the present embodiment, the substrate 301 is a quartz substrate 301 having a thickness of 1.1 mm, an insulating film 302 is a silicon oxynitride film (SiON film) having a thickness of 200 nm, and an amorphous semiconductor film 303 is an amorphous silicon film. The SiON film 302 and the amorphous silicon film 303 are formed by a plasma CVD method.

In the present embodiment, $SiH_4$ and $N_2O$ are first introduced into a reaction chamber at 4 sccm and 400 sccm, respectively, and the SiON film 302 is formed at a deposition temperature of 400° C., a reaction pressure of 30 Pa, a discharge power density of 0.41 W/cm², and a discharge frequency of 60 MHZ. Thereafter, $SiH_4$ is introduced into the reaction chamber at 100 sccm, and the amorphous silicon film 303 is formed at a deposition temperature of 300° C., a reaction pressure of 45 Pa, a discharge power density of 0.037 W/cm², and a discharge frequency of 13.56 MHZ. In the practical process, the amorphous silicon film is patterned into island-like patterns.

Figure 1B:
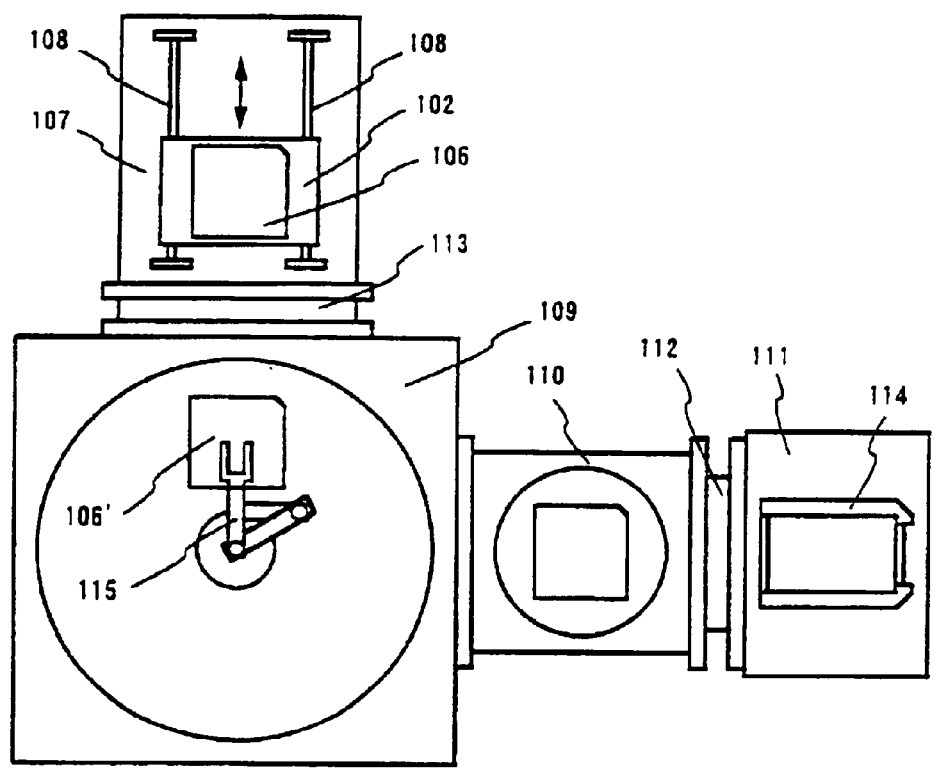

Thereafter, the laser crystallization of the amorphous silicon film 303 is performed by means of the excimer laser apparatus as shown in FIG. 1B. As the reflector 304 in FIG. 3, a tungsten nitride film formed on a silicon substrate is used. Furthermore, a gap of 150 μm is provided between the reflector 304 and the quartz substrate 301.

Under this condition, the amorphous silicon film 303 is irradiated with excimer laser beams (more specifically, the first laser beams 305 and the second laser beams 306) in air at room temperature. The excimer laser beams are reshaped to have a linear cross-section (0.4 mm×160 mm) by the optical system as shown in FIGS. 2A and 2B, and are controlled to scan the substrate from one end to the other end. A scanning speed is set to 1 mm/sec, an energy density (the energy intensity corresponding to Ia in. FIG. 6) is set to 336 mJ/cm², a pulse width is set to 30 ns, a repetition frequency is set to 30 Hz, and an overlapping rate is set to 90%. Thus, the total of 20 shots of the laser beams are able to reach the same area on the a amorphous silicon film 303.

In order to perform the laser crystallization by means of the configuration in the present embodiment, the effective energy intensity $I_o$ of the first energy laser beams is set to be at 151.2 mJ/cm², while the effective energy intensity $I_o'$ of the second energy laser beams is set to be at 77.3 mJ/cm². Accordingly, the effective energy intensity ratio $I_o'/I_o$ in this case is 0.51.

Figure 10:
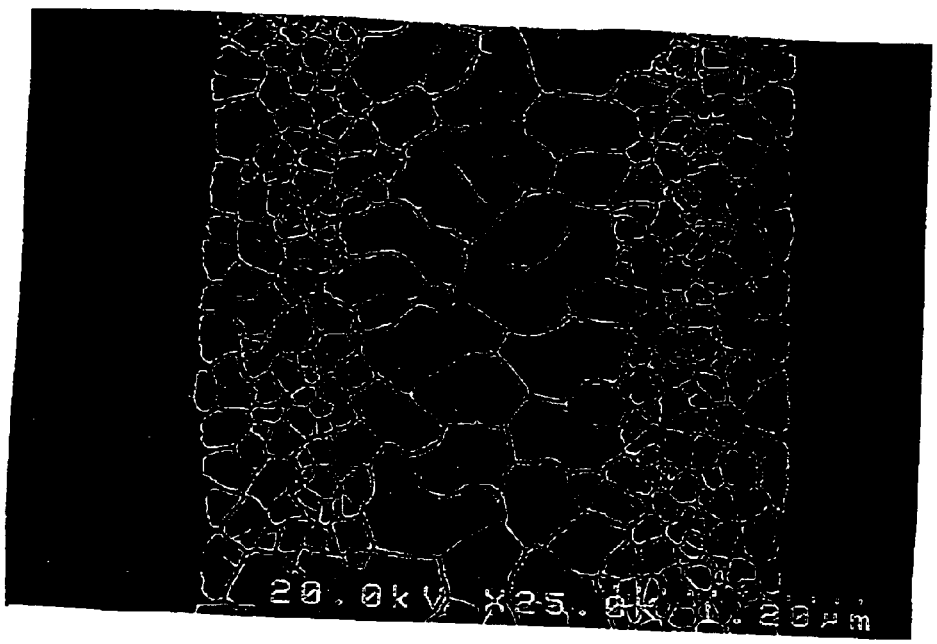
FIG. 10 is a SEM photograph of grains of a polysilicon film.

The SEM photograph of the polysilicon film crystallized in accordance with the present embodiment is shown in FIG. 10. The photograph in FIG. 10 shows the condition after the Secco etching process. The Secco etching process in this case is performed by using a room-temperature etchant in which 50 cc of hydrofluoric acid solution, 25 cc of water, and 1.14 g of potassium chromate (bivalent) are mixed.

As a result, as shown in FIG. 10, relatively large grains with an average grain diameter of about 0.5 to 0.6 μm can be recognized at around the center of the island-like pattern. Although some grains with smaller grain diameters exist in the edge/end portions of the island-like pattern, the locations where such small grains are to be formed can be shifted by varying the energy density of the laser beams to be used. In the case where the polysilicon film crystallized in accordance with the present embodiment is to be used as an active layer of a TFT, those portions with smaller grain diameters may be designed so as not be included in a channel-formation region.

Embodiment 2

In the present embodiment, the case where an amorphous silicon film is crystallized with the configuration shown in Embodiment Mode 1 will be described. The laser crystallization in the present embodiment is the same as that in Embodiment 1, except that a tungsten film is formed on the surface of the reflector 304 and the laser energy density is modified to be at 369 mJ/cm². Embodiment 1 may be referred to for the detailed descriptions about the other conditions.

Figure 11:
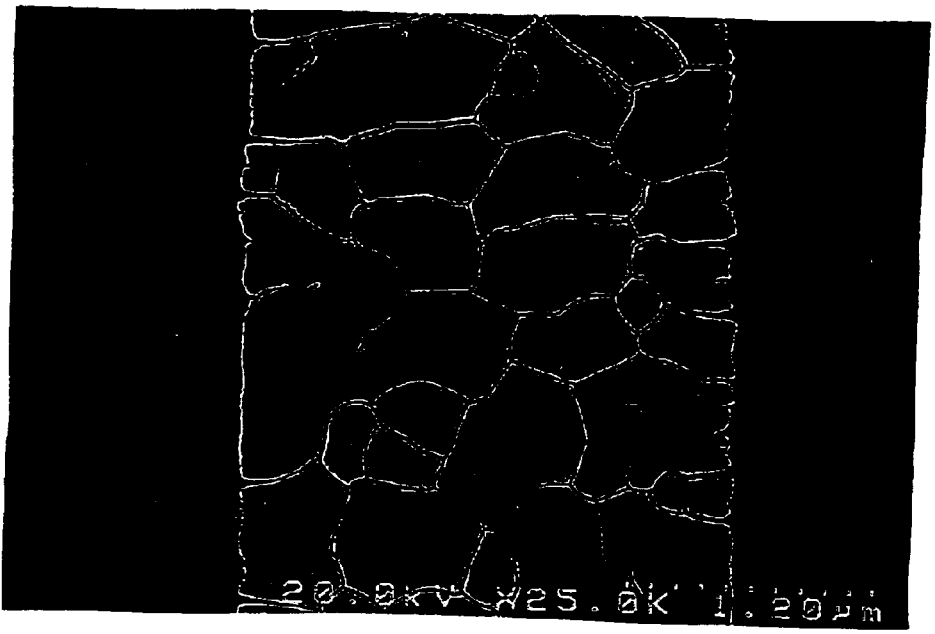
FIG. 11 is a SEM photograph of grains of a polysilicon film.

The SEM photograph of the polysilicon film crystallized in accordance with the present embodiment is shown in FIG. 11. The photograph in FIG. 11 shows the condition after the Secco etching process, as in Embodiment 1. The conditions for the Secco etching process are the same as those in Embodiment 1.

In order to perform the laser crystallization by means of the configuration in the present embodiment, the effective energy intensity $I_o$ of the first energy laser beams is set to be at 166.1 mJ/cm², while the effective energy intensity $I_o'$ of the second energy laser beams is set to be at 88.6 mJ/cm². Accordingly, the effective energy intensity ratio $I_o'/I_o$ in this case is 0.53.

As a result, as shown in FIG. 11, relatively large grains with an average grain diameter of about 0.6 to 0.7 μm can be recognized in the entire island-like pattern. In FIG. 11, grains with smaller grain diameters are not significantly recognized in the edge/end portions of the island-like pattern, unlike the case in FIG. 10. However, grains with smaller grain diameters are sometimes significantly recognized with varying the laser energy density, and therefore, optimization of the laser energy density is critical. Even when grains with smaller grain diameters exist, it is sufficient to design TFTs so that those portions with smaller grain diameters are not included in a channel-formation region of TFTs, as in Embodiment 1.

Embodiment 3

In the present embodiment, the case where an amorphous silicon film is crystallized with the configuration shown in Embodiment Mode 1 will be described. The laser crystallization in the present embodiment is the same as that in Embodiment 1, except that a titanium nitride film is formed on the surface of the reflector 304 and the laser energy density is modified to be at 384 mJ/cm². Embodiment 1 may be referred to for the detailed descriptions about the other conditions.

Figure 12:
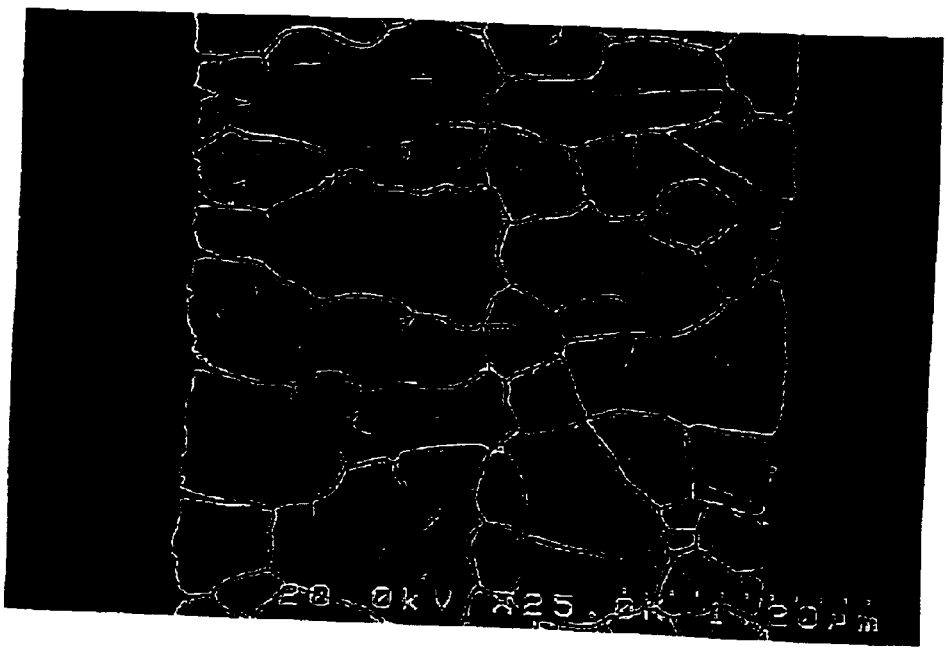
FIG. 12 is a SEM photograph of grains of a polysilicon film.

The SEM photograph of the polysilicon film crystallized in accordance with the present embodiment is shown in FIG. 12. The photograph in FIG. 12 shows the condition after the Secco etching process, as in Embodiment 1. The conditions for the Secco etching process are the same as those in Embodiment 1.

In order to perform the laser crystallization by means of the configuration in the present embodiment, the effective energy intensity $I_o$ of the first energy laser beams is set to be at 172.8 mJ/cm², while the effective energy intensity $I_o'$ of the second energy laser beams is set to be at 57.6 mJ/cm². Accordingly, the effective energy intensity ratio $I_o'/I_o$ in this case is 0.33.

As a result, as shown in FIG. 12, relatively large grains with an average grain diameter of about 0.8 to 1.0 μm can be recognized in the entire island-like pattern. Each of these grains has an elongated-shape in the horizontal direction within the drawing sheet, which implies that crystallization may proceed from the edge portion in the lateral direction of the island-like pattern. Such tendency can also be slightly recognized in FIG. 11.

In addition, grains with smaller grain diameters are sometimes significantly recognized with varying the laser energy density, and therefore, optimization of the laser energy density is critical. Even when grains with smaller grain diameters exist, it is sufficient to design TFTs so that those portions with smaller grain diameters are not included in a channel-formation region of TFTs, as in Embodiment 1.

Embodiment 4

In the present embodiment, a method of forming a polysilicon film, to be used as an active layer of a TFT, in accordance with the method described in Embodiment Mode 1 or 2 will be described with reference to FIGS. 13A–13E.

First, a silicon oxynitride film (not illustrated) is formed to have a thickness of 200 nm on a glass substrate, and an amorphous silicon film (not illustrated) is then formed thereon to have a thickness of 50 nm. The amorphous silicon film is then patterned to form island-like patterns 701a and 701b each made of the amorphous silicon film (see FIG. 13A).

The thus-formed island-like patterns 701a and 701b are then subjected to the laser crystallization in accordance with the method described in Embodiment Mode 1 or 2. The island-like patterns 702a and 702b made of a polysilicon film obtained through the laser crystallization may include smaller-grain regions 703a and 703b, respectively, in the edge/end portions thereof. Furthermore, the edge/end portions of the island-like patterns 702a and 702b contain a lot of crystal defects and/or lattice strain (see FIG. 13B).

The broken lines designated with reference numerals 704a and 704b in FIG. 13B respectively indicate the original size of the island-like patterns 701a and 701b made of the amorphous silicon film. Thus, the sizes of those island-like patterns are reduced through the laser crystallization by about 1 to 15%. This reduction in size is considered to occur because the silicon films come to have a finer crystal structure and/or the silicon films are vaporized. However, any mechanism therefor has not yet been made clear in detail.

Thereafter, the island-like patterns 702a and 702b made of the polysilicon film are further patterned to form active layers 705a and 705b. The broken lines designated with reference numerals 706a and 706b respectively indicate the original peripheries of the small-grain regions 703a and 703b (see FIG. 13C).

Then, a silicon oxynitride film having a thickness of 80 nm is formed to cover the active layers 705a and 705b so as to form gate insulating films. A gate electrode 707 is further formed thereon. The gate electrode 707 is typically made of a layered-structure including a tungsten nitride film and a tungsten film, and has a total thickness of 300 nm (see FIG. 13D).

After the formation of the gate electrode 707, an impurity that imparts an n-type conductivity is doped, so that a source region 708a, a drain region 709a and an LDD region 710 are formed. Furthermore, an impurity that imparts a p-type conductivity is selectively doped, so that a source region 708b and a drain region 709b are formed. During this p-type impurity doping process, channel-formation regions 711a and 711b (i.e., portions of the active layers to which no impurities are doped) are simultaneously formed.

An interlayer insulating film (not illustrated) made of a silicon oxide film is then formed to have a thickness of 1 μm. Thereafter, contact holes are provided to form source wirings 712a and 712b, and a drain wiring 713. These wirings may be formed of a conductive film having a low resistance, which contains an aluminum film as its main constituting component (see FIG. 13E).

According to the fabrication steps as set forth above, a CMOS circuit 716 having the configuration as shown in FIG. 13E is formed, in which an n-channel type TFT 714 and a p-channel type TFT 715 are complementarity combined.

The present embodiment is only one exemplary embodiment in which the present invention is applied for forming an active layer of a TFT. The present invention is not limited to the fabrication process as set forth above. Rather, the present invention is applicable to any other known fabrication processes for TFTS. It should be noted, however, that the present invention is not applicable to the case where a light shielding film or the like is to be provided beneath the active layer, i.e., the case where both the top and back surfaces of an amorphous semiconductor film cannot be simultaneously laser-annealed.

Although the CMOS circuit is formed in accordance with the present embodiment, pixel TFTs to be provided in a pixel region of an active-matrix type image display device can be easily fabricated with the known technique.

Embodiment 5

Although the present invention has been applied to the formation of an active layer in a TFT in Embodiment 4, the present invention is applicable to all the semiconductor devices in which a TFT is to be used. For example, the present invention is applicable to an active-matrix type liquid crystal display, an active-matrix type EL (Electro-Luminescence) display, or an active-matrix type EC (Electro-Chromics) display.

Furthermore, the present invention is applicable to the formation of a load transistor of an SRAM to be used in ICs or LSIS. The present invention is also effective for forming TFTs in a three-dimensional structure over an IC or an LSI.

Embodiment 6

Figure 14A:
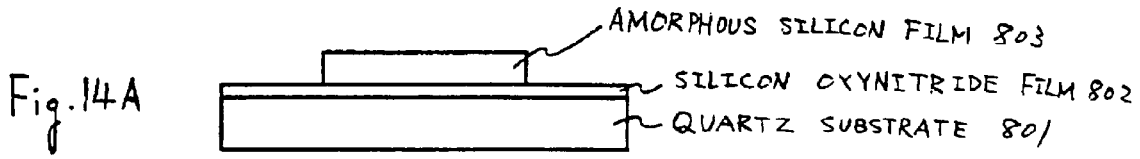
FIGS. 14A and 14B illustrate cross-sectional views of sample configurations.
Figure 14B:
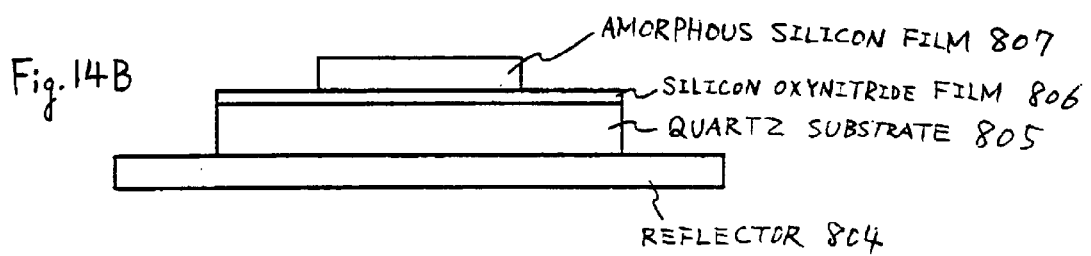

In the present embodiment, the structures as shown in FIGS. 14A and 14B are irradiated with laser beams under the conditions as described in Embodiment 1.

In the structure shown in FIG. 14A, reference numeral 801 denotes a quartz substrate having a thickness of 1.1 mm, 802 denotes a silicon oxynitride film having a thickness of 200 nm, and 803 denotes an amorphous silicon film having a thickness of 55 nm. Thus, with respect to the structure in FIG. 14A, the conventional laser crystallization is to be conducted.

On the other hand, in the structure shown in FIG. 14B, reference numeral 804 denotes a reflector having a surface (reflecting surface) made of a tantalum nitride film, 805 denotes a quartz substrate having a thickness of 1.1 mm, 806 denotes a silicon oxynitride film having a thickness of 200 nm, and 807 denotes an amorphous silicon film having a thickness of 55 nm. Thus, with respect to the structure in FIG. 14B, the laser crystallization is to be performed in accordance with the present invention.

Figure 15A:
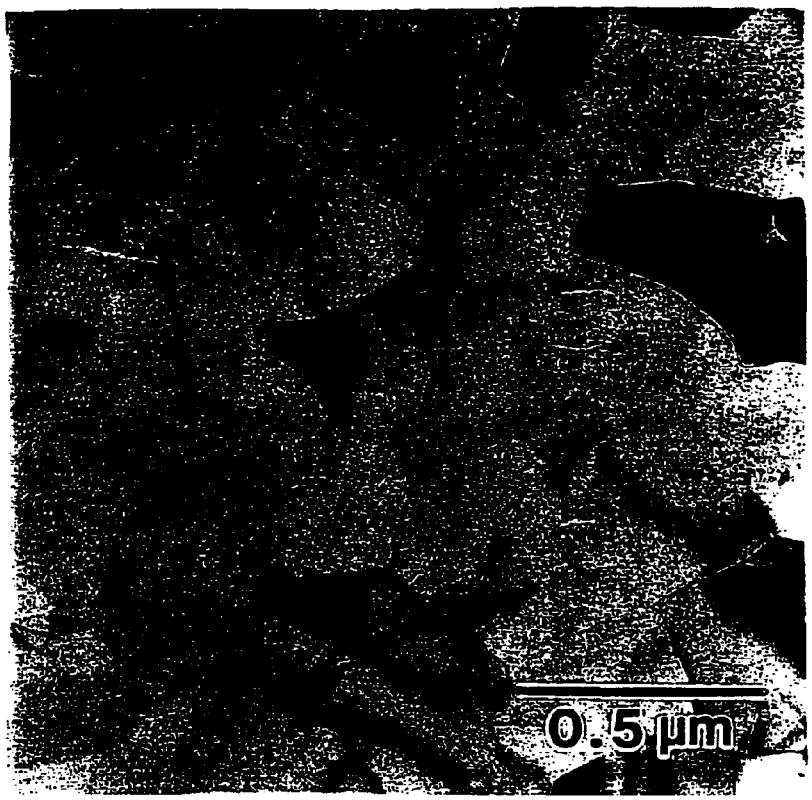
FIGS. 15A and 15B are TEM photographs of grains of polysilicon films.
Figure 15B:

The TEM (Transmission Electron Microscopy) photographs of the resultant polysilicon films are shown in FIGS. 15A and 15B. More specifically, FIG. 15A shows the TEM photograph of a polysilicon film obtained by crystallizing the amorphous silicon film 803 in the structure shown in FIG. 14A, while FIG. 15B shows the TEM photograph of a polysilicon film obtained by crystallizing the amorphous silicon film 807 in the structure shown in FIG. 14B.

By comparing FIGS. 15A and 15B, the polysilicon in FIG. 15B crystallized in accordance with the present invention clearly has larger grain diameters. Thus, it has been confirmed from these TEM photographs that the present invention can provide a crystalline semiconductor film with an enlarged average grain diameter.

Embodiment 7

The experiments conducted by the present inventors indicate that particular conditions exist under which the average grain diameter can be significantly enlarged when the effective energy intensity ratio $I_o'/I_o$ satisfies the relationship of $0<I_o'/I_o<1$ or $1<I_o'/I_o$.

In the present embodiment, the experiments are conducted with various substrates (each having a thickness of 1.1 mm) or reflectors (more strictly speaking, the reflecting surface of the reflector) made of different materials. Table 1 shows the substrates and the reflectors in the samples (A)–(H) used in the experiments, as well as the effective energy intensity ratios therefor.

TABLE 1

| Sample | Substrate | Reflector | Effective energy intensity ratio |
|---|---|---|---|
| (A) | quartz | Al | 1.00 |
| (B) | quartz | Si | 0.67 |
| (C) | quartz | W | 0.53 |
| (D) | quartz | Tin | 0.33 |
| (E) | #1737 | Al | 0.29 |
| (F) | #1737 | W | 0.16 |
| (G) | #1737 | Ta | 0.11 |
| (H) | AN100 | Al | 0.07 |

In Table 1, "#1737" is a commercial designation for the glass substrate available from Corning, and "AN100" is a commercial designation for the glass substrate available from Asahi Glass Company.

The samples were irradiated with the XeCl laser beams under the same conditions as Embodiments 1–3 with the effective energy intensity ratio in the range of 0.07 to 1.0, and the resultant polysilicon films are observed by means of SEM.

As a result, it has confirmed that the average grain diameter of about 1 μm can be obtained with the effective energy intensity ratio of 0.29, 0.33. 0.53 and 0.67, while the average grain diameter of about 0.3 μm can be obtained with the effective energy intensity ratio of 1.0, 0.16, 0.11 and 0.07. Accordingly, the average grain diameter is believed to be significantly enlarged under the condition in which the effective energy intensities of the first and second laser beams are different by 20% or more. The above results are believed to indicate that the optimal crystallization condition is realized when the effective energy intensity ratio $I_o'/I_o$ is in the range of 0.2 to 0.9 (more preferably, in the range of 0.3 to 0.7).

Embodiment 8

In the present embodiment, the case where another optical system having the configuration different from that as described in Embodiment Mode 2 will be described with reference to FIG. 16. More specifically, the configuration in the present embodiment allows the length of the linear laser beams in the longitudinal or width direction to be variable.

When an optical system 10 in the present embodiment is employed, it is possible to set a shorter length in the longitudinal direction of the linear laser beams for a semiconductor film which requires a higher energy input for crystallization, while setting a longer length in the longitudinal direction of the linear laser beams for a semiconductor film which can be crystallized at a relatively low energy input. Thus, the maximum energy efficiency can be always achieved. In addition, by allowing a length in the width direction of the linear laser beams to be variable, the most suitable widthwise length for the crystallization of semiconductor films can be determined.

The optical system shown in FIG. 16 is different from that in FIG. 5 in which in addition to the cylindrical array lens 502 for dividing the laser beams in the width direction, another cylindrical array lens 11 for exhibiting the similar function is employed, and in addition to the cylindrical array lens 503 for dividing the laser beams in the longitudinal direction, another cylindrical array lens 12 for exhibiting the similar function is employed.

In the present embodiment, modification of the cross-section of the linear laser beams in the longitudinal direction is conducted in the same manner as that in the width direction. Accordingly, only the two cylindrical array lenses for functioning to divide the laser beams in the longitudinal direction will be described here.

Each portion of the laser beams divided in the longitudinal direction by the cylindrical array lens 503 is allowed to be incident onto each corresponding cylindrical lens forming the cylindrical array lens 12. More specifically, when the cylindrical array lens 507 is divided into seven sections, the cylindrical array lens 12 will be also divided into seven sections in the corresponding manner. The cylindrical array lenses 503 and 12 may have the same shape. Alternatively, these cylindrical array lenses 503 and 12 may be the same, except for the radius of curvature.

At this point, a variable range of length of the laser beams can be determined in accordance with combinations of focal lengths. More specifically, by changing the distance between the cylindrical array lenses 503 and 12, the length of the linear laser beams in the longitudinal direction can be determined.

It is preferable that the distance between the cylindrical array lenses 503 and 12 is twice shorter than the focal length of the cylindrical array lens 503. In this case, the respective divided portions of the laser beams divided by the cylindrical array lens 503 can be incident on the corresponding cylindrical lens in the cylindrical array lens 12 in one-to-one relationship.

Figure 17A:
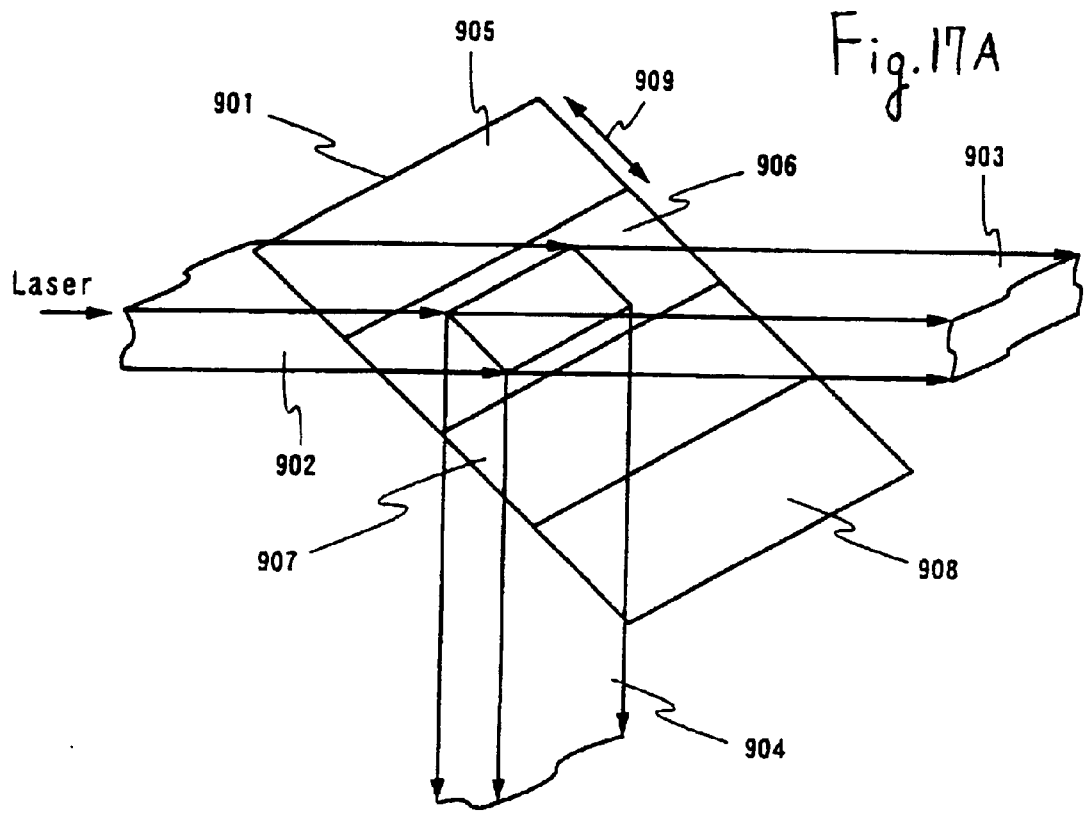
FIGS. 17A and 17B Illustrate views intended to explain a transmittance-variable type half mirror.

Furthermore, in the present embodiment, a transmittance-variable type half mirror is used as the half mirror 13. The configuration thereof will be described with reference to FIGS. 17A and 17B. First, an exemplary configuration of the transmittance-variable type half mirror in FIG. 17A will be explained.

Laser beams 902 coming from the left side in the drawing sheet are divided into laser beams 903 and 904 by a transmittance-variable type half mirror 901. The transmittance-variable type half mirror 901 includes regions 905–908 respectively having difference transmittances.

As the transmittance-variable type half mirror 901 is moved in the direction indicated by an arrow 909 which is parallel to the transmittance-variable type half mirror 901, an energy intensity of the laser beams 903 passed through the transmittance-variable type half mirror 901 can be set at a level different from that of the reflected laser beams 904. Although the four regions 905–908 are provided in the configuration shown in FIG. 17A, the number of these regions is not limited to 4, as long as two or more regions are provided.

Figure 17B:
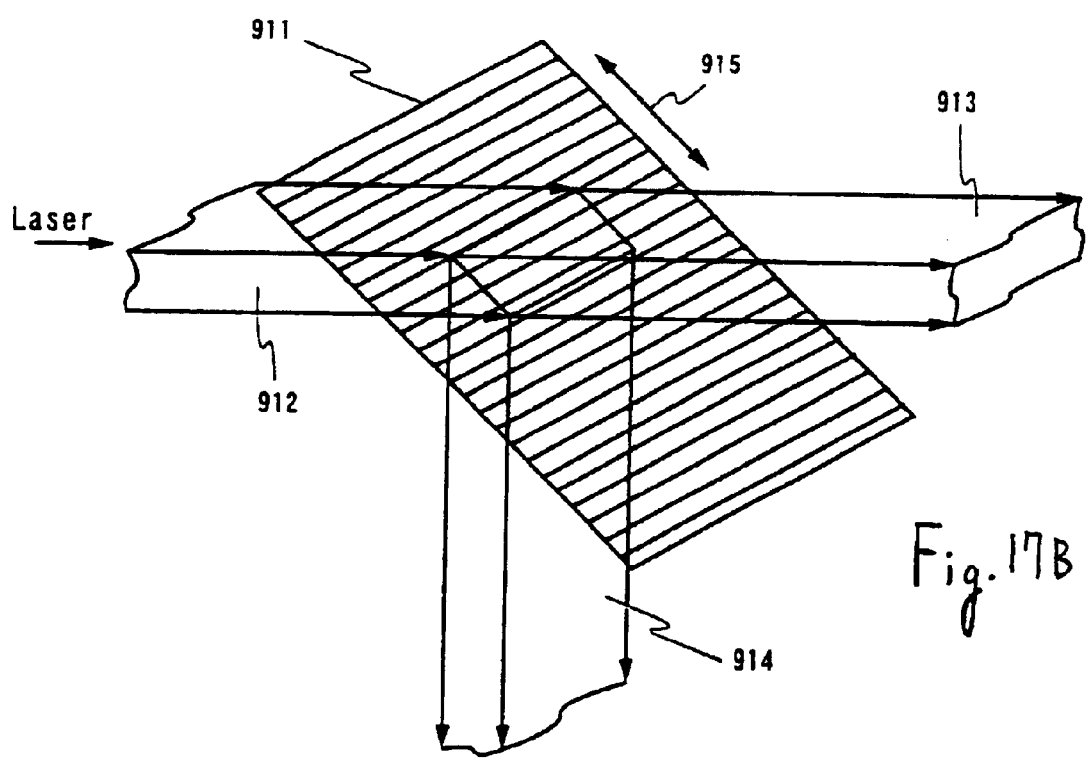

Another exemplary configuration of a transmittance-variable type half mirror is shown in FIG. 17B. In this case, laser beams 912 coming from the left side in the drawing sheet are divided into laser beams 913 and 914 by a transmittance-variable type half mirror 911. The transmittance-variable type half mirror 911 is divided into more regions as compared to the half mirror 901 in FIG. 17A, and the transmittances are set to be varied in the fine step-like manner between the respective regions.

This kind of transmittance-variable type half mirror is commercially available from the market. Even when the regions with different transmittances are provided in the fine step-like manner, an energy intensity of the laser beams 913 passed through the transmittance-variable type half mirror 911 can be set at a level different from that of the reflected laser beams 914 as the transmittance-variable type half mirror 911 is moved in the direction indicated by an arrow 915.

With one of the optical systems as set forth above, the energy intensity of the laser beams in the final stage, with which a semiconductor film is to be irradiated, can be adjusted. The configuration of the optical system described in the present embodiment is also applicable to the laser apparatus described in Embodiment 1.

Embodiment 9

In the present embodiment, the effective energy intensity ratio in Embodiment 7 is calculated, with effects of multiple reflections at a reflecting surface of a reflector being taken into consideration. The samples (A)–(H) used in the experiments of the present embodiment are the same as the sample (A)–(H) in Embodiment 7. It should be noted that in the present embodiment, the effective energy intensity $I_o'$ of the second laser beams can be expressed as $I_o'=I_a \times T_{sub} \times R_{mirror} \times T_{sub} \times (1-R_{SiON-Si})/1-R_{SiON-Si} \times T_{sub} \times R_{mirror} \times T_{sub}$.

In the above equation, $T_{sub}$ indicates the transmittance of a substrate, $R_{mirror}$ indicates the reflectance at a surface of a reflector, and $R_{SiON-Si}$ indicates the reflectance experienced by the light beams incident onto the amorphous silicon film from an SiON film. The reflectance experienced by the light beams incident onto the SiON film from air, the transmittance in the SiON film, the reflectance experienced by the light beams incident on the substrate from the SiON film, and the reflectance experienced by the light beams incident on the SiON film from the substrate are found to be negligible from the experimental results, and therefore not considered in the calculation.

The data calculated from the above are shown in Table 2. More specifically the data in Table 2 are the modified version of the data in Table 1, modified by taking the effects of multiple reflections into consideration.

TABLE 2

| Sample | Substrate | Reflector | Effective energy intensity ratio |
|---|---|---|---|
| (A) | quartz | Al | 1.66 |
| (B) | quartz | Si | 0.81 |
| (C) | quartz | W | 0.61 |
| (D) | quartz | Tin | 0.33 |
| (E) | #1737 | Al | 0.32 |
| (F) | #1737 | W | 0.17 |
| (G) | #1737 | Ta | 0.14 |
| (H) | AN100 | Al | 0.06 |

Based on the data, the same optimal crystallization condition as in Embodiment 7, i.e., the effective energy intensity ratio $I_o'/I_o$ of 0.2 to 0.9 (more preferably 0.3 to 0.7), can be obtained.

Embodiment 10

Figure 18A:
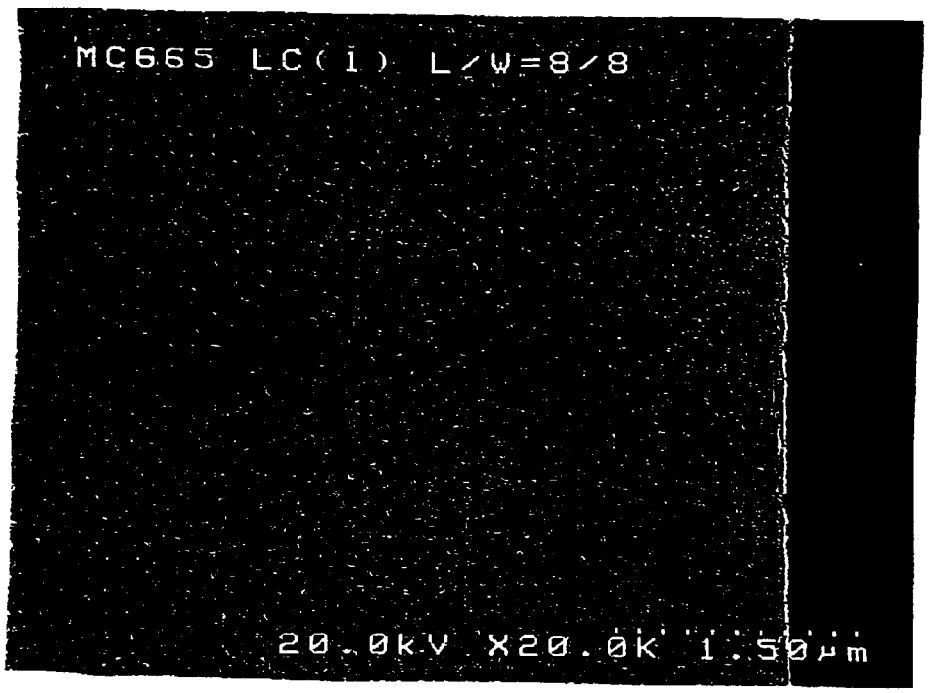
FIGS. 18A and 18B are SEM photographs of the crystallized condition of polysilicon films.
Figure 18B:
Figure 19A:
FIGS. 19A and 19B are SEM photographs of the crystallized condition of polysilicon films.
Figure 19B:
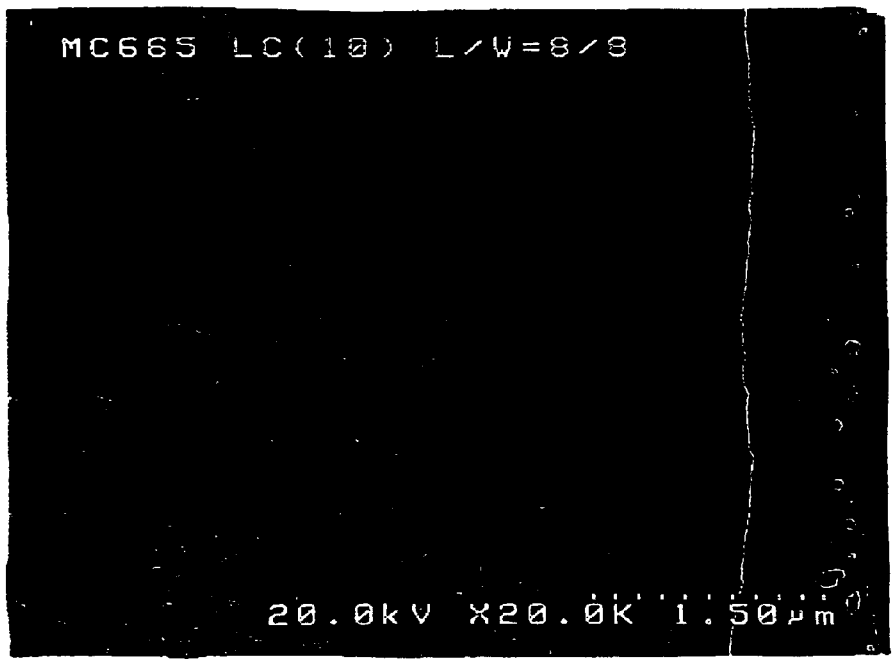

In the present embodiment, advantages obtainable in accordance with the present invention will be described based on the experimental results. In the description of the present embodiment below, crystallinity is relatively evaluated in five grades. More specifically, in the present specification, crystallinity is categorized into the following five grades for evaluation:

Crystallized condition (0): in which the film has disappeared due to ablation;

Crystallized condition (1): in which fine grains can be recognized as shown in FIG. 18A;

Crystallized condition (2): in which grains with the average grain diameter of about 300 to 450 nm can be recognized as shown in FIG. 18B;

Crystallized condition (3): in which relatively large grains with the average grain diameter of about 600 to 800 nm can be recognized as shown in FIG. 19A; and Crystallized condition (4): in which grains of significantly large size, having a longer diameter of about 3 μm or more, can be recognized as shown in FIG. 19B.

In particular, in the present embodiment, the grains in Crystallization condition (4) are also referred to as grains formed by SLG (Super Lateral Growth).

Based on the above-mentioned evaluation criteria, the relationship between the conditions of laser crystallization and the crystallization conditions is investigated. The data shown in FIG. 20 are the results obtained by comparing the relationship between the irradiation energy (corresponding to the energy intensity of $I_a$ of the laser beams immediately prior to arrival at the amorphous silicon film) and the crystallization condition in a single irradiation mode with that in a dual irradiation mode. In the single irradiation mode, only the top surface of the amorphous semiconductor film is irradiated with the laser beams, while both the top and back surfaces of the amorphous semiconductor film are irradiated with the laser beams in the dual irradiation mode.

As can be made clear from the data in FIG. 20, the dual irradiation mode can provide a crystallized film with satisfactory crystallization condition at a lower irradiation energy, as compared to the single irradiation mode. More specifically, in the case of the single irradiation mode, the irradiation energy of about 510 mJ/cm$^2$ is required to realize the SLG, while the irradiation energy of about 440 to 460 mJ/cm$^2$ is sufficient for the SLG in the case of the dual irradiation mode. This indicates that the dual irradiation mode to be employed in accordance with the present invention can provide a crystallized semiconductor film in highly crystallized condition at a lower irradiation energy, as compared to the conventional single irradiation mode.

Furthermore, it is known from the experiments that the higher the irradiation energy is, the higher the effective energy of the first laser beams becomes, thereby resulting in larger surface roughness of the resultant crystalline semiconductor film. This implies that the dual irradiation mode causes less damages onto the film surface for obtaining the grains formed by SLG.

Figure 21A:
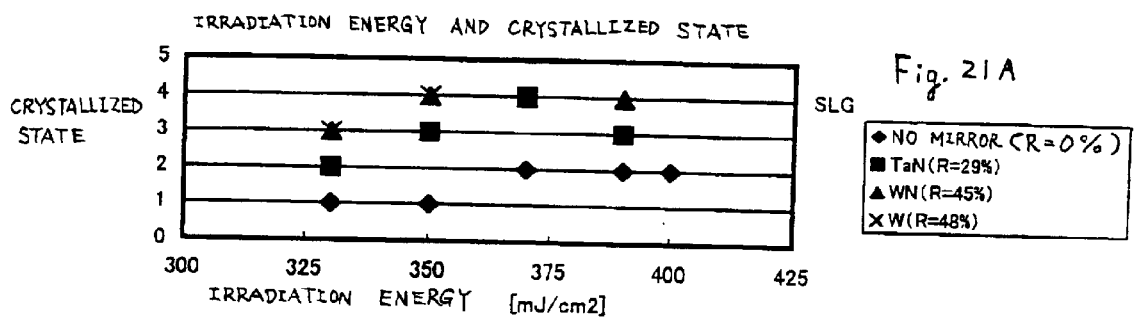
FIGS. 21A and 21B are graphs indicating the relationship between the irradiation energy or the effective Incident energy and the crystallized state.

Then the results of experiments in which the effective energy intensity ratio is varied by changing the reflectance of the reflector will be described. FIG. 21A shows the relationship between the irradiation energy and the crystallization condition, while FIG. 21B shows the relationship between the effective incident energy and the crystallization conditions.

As shown in FIG. 21A, the higher the reflectance of the reflector is (I.e., the higher the effective energy intensity of the second laser beams is), the more satisfactory crystallization condition can be obtained even at the same irradiation energy. This is believed to be caused because the dual irradiation mode can provide the higher effective incident energy than the single irradiation mode with the same irradiation energy. The effective incident energy is the sum of all of the effective energies that are input into the amorphous semiconductor film, and more specifically, corresponds to the sum of the effective energy intensity of the first laser beams and that of the second laser beams.

In light of the above, the relationship between the effective incident energy and the crystallization condition is investigated with the irradiation energy being set at the same level. As a result, the higher the reflectance is, the more the effective incident energy required to obtain the grains formed by SLG (i.e., Crystallization condition (4)) is shifted toward the higher energy side, as shown in FIG. 21B. In other words, the reflector with a lower reflectance is suitable for providing the grains formed by SLG at a lower effective incident energy, and therefore, crystallization with a lower energy loss can thus be realized.

Figure 21B:
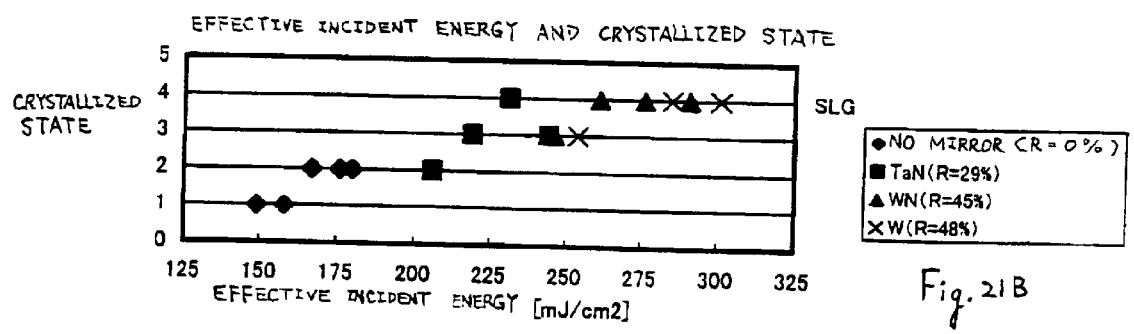

Furthermore, as shown in FIG. 21B, the effective incident energy required for realizing the SLG is reduced as the reflectance of the reflector is lowered. However, it has been confirmed that no SLG occurs when the reflectance is zero. Thus, it is believed that any optimal value exists in the reflectance of the reflector for realizing the SLG.

As described above, in accordance with the present invention, upon the laser crystallization of an amorphous semiconductor film, a top surface and a back surface of the amorphous semiconductor film are simultaneously irradiated with laser beams while an effective energy intensity of the laser beams to be applied onto the back surface is set at a level different from that of the laser beams to be applied onto the top surface, thereby resulting in a crystalline semiconductor film with a larger average grain diameter as compared to crystalline semiconductor films obtainable in the conventional art.

By obtaining a crystalline semiconductor film with a large average grain diameter, the performance of TFTs, or semiconductor devices formed with TFTs such as an active-matrix type display device, can be significantly improved.

What is claimed is:

1. A laser apparatus comprising:
    a laser source;
    an optical system for guiding laser beams emitted from the laser source onto a top surface and a back surface of an object to be treated; and
    a stage for holding the object;
    wherein the laser apparatus further comprises a reflector disposed between the object and the stage, and the laser beams to be guided to the back surface of the object are reflected at the reflector prior to arrival at the back surface of the object.

2. An apparatus according to claim 1, wherein the reflectance of the reflector with respect to the laser beams is in the range of 20 to 80%.

3. An apparatus according to claim 1, wherein the laser beams are reshaped by the optical system to have a linear cross-section.

4. A laser apparatus comprising:
    a laser source for emitting a laser light;
    a half mirror for dividing the laser light into a first laser light and a second laser light;
    an optical system for guiding the first laser light and the second laser light onto a top surface and a back surface of an object to be treated, respectively; and
    a substrate holder for holding a substrate provided with the object to be treated;
    wherein the optical system includes a filter for attenuating the first laser light; and
    wherein the object to be treated comprises a semiconductor film.

5. A laser apparatus comprising:
    a laser source for emitting a laser light;
    a half mirror for dividing the laser light into a first laser light and a second laser light; and
    an optical system for guiding the first laser light and the second laser light onto a top surface and a back surface of an object to be treated, respectively;
    wherein the optical system includes a filter for attenuating the first laser light; and
    wherein the laser beams are reshaped by the optical system to have a linear cross-section.

6. A method for forming a semiconductor device, said method comprising:
    generating a laser light from a laser source used as an oscillating source;
    dividing the laser light into a first laser light and a second laser light through an optical system;
    linearly reshaping the first and second laser lights;
    attenuating the first laser light; and
    irradiating a surface of an object with the attenuated first laser light and the second laser light at a same position,
    wherein an effective energy intensity $I_o$ of the first laser light is set at a level different from an effective energy intensity $I_o'$ of the second laser light at the same position.

7. A method of forming a semiconductor device comprising:
    irradiating a first laser light to a top surface of an object;
    irradiating a second laser light to a back surface of the object; and linearly reshaping the first and second laser lights;
    wherein an effective energy intensity in of the first laser light to be applied onto the top surface is set at a level different from an effective energy intensity $I_o'$ of the second laser light to be applied onto the back surface; thereby forming a semiconductor device.

8. A method according to claim 7, wherein the object is an amorphous semiconductor film or a microcrystalline semiconductor film.

9. A method for forming a semiconductor device, said method comprising:
    generating a laser light from a laser source used as an oscillating source;
    dividing the laser light into a first laser light and a second laser light through an optical system;
    linearly reshaping the first and second laser lights;
    attenuating the first laser light;
    irradiating a surface of an object with the attenuated first laser light and the second laser light at a same position;
    wherein an effective energy intensity $I_o$ of the first laser light and an effective energy intensity $I_o'$ of the second laser light satisfy the relationship of $0<I_o'/I_o<1$ or $1<I_o'/I_o$ at the same position.

10. A method of forming a semiconductor device, said method comprising:
    irradiating a first laser light to a top surface of an object;
    irradiating a second laser light to a back surface of the object; and linearly reshaping the first and second laser lights;

wherein an effective energy intensity $I_o'$ of the first laser light to be applied onto the ton surface and an effective energy intensity $I_o'$ of the second laser light to be applied onto the back surface satisfy the relationship of $0<I_o'/I_o<1$ or $1<I_o'/I_o$, thereby forming a semiconductor device.

11. A method according to claim 10, wherein the object is an amorphous semiconductor film or a microcrystalline semiconductor film.

12. A method of laser annealing, said method comprising:
generating laser lights from a laser source used as an oscillating source; and
irradiating a top surface and a back surface of an object with the laser lights,
wherein the laser lights to be applied onto the back surface of the object are reflected at a reflector disposed on the back surface side of the object prior to arrival at the back surface of the object;
thereby laser annealing the object.

13. A method according to claim 12, further comprising linearly reshaping the first and second laser lights.

14. A method according to claim 12, wherein the object is an amorphous semiconductor film or a microcrystalline semiconductor film.

15. A method of laser annealing, said method comprising:
generating laser lights from a laser source used as an oscillating source; and
irradiating a top surface and a back surface of an object with the laser lights;
wherein the laser lights to be applied onto the back surface of the object are reflected at a reflector disposed on the back surface side of the object prior to arrival at the back surface of the object, and an effective energy intensity $I_o$ of the laser beams to be applied onto the top surface is set at a level different from an effective energy intensity $I_o'$ of the laser beams to be applied onto the back surface;
thereby laser annealing the object.

16. A method according to claim 15, further comprising linearly reshaping the first and second laser lights.

17. A method according to claim 15, wherein the object is an amorphous semiconductor film or a microcrystalline semiconductor film.

18. A method of laser annealing, said method comprising:
generating laser lights from a laser source used as an oscillating source; and
irradiating a top surface and a back surface of an object with the laser lights;
wherein the laser lights to be applied onto the back surface of the object are reflected at a reflector disposed on the back surface side of the object prior to arrival at the back surface of the object, and an effective energy intensity $I_o$ of the laser beams to be applied onto the top surface and an effective energy intensity $I_o'$ of the laser beams to be applied onto the back surface satisfy the relationship of $0<I_o'/I_o<1$ or $1<I_o'/I_o$;
thereby laser annealing the object.

19. A method according to claim 18, further comprising linearly reshaping the first and second laser lights.

20. A method according to claim 18, wherein the object is an amorphous semiconductor film or a microcrystalline semiconductor film.

21. A method for forming a semiconductor device, said method comprising:
generating a laser light from a laser source used as an oscillating source;
dividing the laser light into a first laser light and a second laser light through an optical system;
attenuating the first laser light by an attenuation filter;
irradiating a top surface of an object with the attenuated first laser light; and
irradiating a back surface of the object with the second laser light;
thereby forming a semiconductor device.

22. A method according to claim 21, further comprising linearly reshaping the first and second laser lights.

23. A method according to claim 21, wherein the object is an amorphous semiconductor film or a microcrystalline semiconductor film.

24. A method for forming a semiconductor device, said method comprising:
generating a laser light from a laser source used as an oscillating source;
dividing the laser light into a first laser light and a second laser light through an optical system;
attenuating the first laser light by an attenuation filter;
irradiating a top surface of an object with the attenuated first laser light; and
irradiating a back surface of the object with the second laser light;
wherein an effective energy intensity $I_o$ of the first laser light to be applied onto the top surface is set at a level different from an effective energy intensity $I_o'$ of the second laser light to be applied onto the back surface;
thereby forming a semiconductor device.

25. A method according to claim 24, further comprising linearly reshaping the first and second laser lights.

26. A method according to claim 24, wherein the object is an amorphous semiconductor film or a microcrystalline semiconductor film.

27. A method for forming a semiconductor device, said method comprising:
generating a laser light from a laser source used as an oscillating source;
dividing the laser light into a first laser light and a second laser light through an optical system;
attenuating the first laser light by an attenuation filter;
irradiating a top surface of an object with the first laser light; and
irradiating a back surface of the object with the second laser light;
wherein an effective energy intensity $I_o$ of the first laser light to be applied onto the top surface and an effective energy intensity $I_o'$ of the second laser light to be applied onto the back surface satisfy the relationship of $0<I_o'/I_o<1$ or $1<I_o'/I_o$;
thereby forming a semiconductor device.

28. A method according to claim 27, further comprising linearly reshaping the first and second laser lights.

29. A method according to claim 27, wherein the object is an amorphous semiconductor film or a microcrystalline semiconductor film.

30. A laser apparatus comprising:
a laser source for emitting a laser light;
a half mirror for dividing the laser light into a first laser light and a second laser light;
an optical system for guiding the first laser light and the second laser light onto a top surface and a back surface of an object to be treated, respectively;

a substrate holder for holding a substrate;

wherein the optical system includes a filter for attenuating the second laser light and cylindrical lenses for reshaping the first and second laser lights linearly; and wherein a semiconductor film is formed over the substrate.

31. A method for forming a semiconductor device, said method comprising:

generating a laser light from a laser source used as an oscillating source;

dividing the laser light into a first laser light and a second laser light through an optical system;

linearly reshaping the first and second laser lights;

attenuating the second laser light by an attenuation filter;

irradiating a top surface of an object with the first laser light; and irradiating a back surface of the object with the attenuated second laser light;

thereby forming a semiconductor device.

32. A method for forming a semiconductor device, said method comprising:

generating a laser light from a laser source used as an oscillating source;

dividing the laser light into a first laser light and a second laser light through an optical system;

linearly reshaping the first and second laser lights;

attenuating the second laser light by an attenuation filter;

irradiating a top surface of an object with the first laser light; and irradiating a back surface of the object with the attenuated second laser light;

wherein an effective energy intensity $I_o$ of the first laser light to be applied onto the top surface is set at a level different from an effective energy intensity $I_o'$ of the second laser light to be applied onto the back surface;

thereby forming a semiconductor device.

33. A method for forming a semiconductor device, said method comprising:

generating a laser light from a laser source used as an oscillating source;

dividing the laser light into a first laser light and a second laser light through an optical system;

linearly reshaping the first and second laser lights;

attenuating the second laser light by an attenuation filter;

irradiating a top surface of an object with the first laser light; and irradiating a back surface of the object with the attenuated second laser light;

wherein an effective energy intensity $I_o$ of the first laser light to be applied onto the top surface and an effective energy intensity $I_o'$ of the second laser light to be applied onto the back surface satisfy the relationship of $0<I_o'/I_o<1$ or $1<I_o'/I_o$.

34. A laser apparatus comprising:

a laser source;

an optical system for guiding laser beams emitted from the laser source onto a top surface and a back surface of an object to be treated, said object provided over a substrate; and a stage for holding the substrate;

wherein the laser apparatus further comprises a reflector disposed between the object and the stage;

wherein said reflector is in contact with the substrate.

35. A method according to claim 34, wherein the laser beams to be guided to the back surface of the object are reflected at the reflector prior to arrival at the back surface of the object.

* * * * *